United States Patent
Yamaguchi et al.

(10) Patent No.: US 6,192,502 B1
(45) Date of Patent: Feb. 20, 2001

(54) INFORMATION REPRODUCING APPARATUS AND REPRODUCING METHOD

(75) Inventors: Shigeo Yamaguchi, Kanagawa; Takayoshi Chiba, Tokyo; Junichi Horigome, Kanagawa, all of (JP)

(73) Assignee: Sony Corporation, Tokyo (JP)

( * ) Notice: Under 35 U.S.C. 154(b), the term of this patent shall be extended for 0 days.

(21) Appl. No.: 09/057,796

(22) Filed: Apr. 9, 1998

(51) Int. Cl.[7] .................................................. H03M 13/41
(52) U.S. Cl. ............................................................ 714/795
(58) Field of Search ............................................ 714/795

(56) References Cited

U.S. PATENT DOCUMENTS

| | | | |
|---|---|---|---|
| 4,777,636 | 10/1988 | Yamashita et al. | 371/43 |
| 5,291,499 | 3/1994 | Behrens et al. | 371/43 |
| 5,311,523 | 5/1994 | Serizawa et al. | 371/43 |
| 5,341,386 | 8/1994 | Shimoda et al. | 371/43 |
| 5,675,569 * | 10/1997 | Yamaguchi et al. | 369/124 |
| 5,689,488 | 11/1997 | Yamaguchi | 369/59 |
| 5,729,517 * | 3/1998 | Fujiwara et al. | 369/59 |
| 5,781,590 * | 7/1998 | Shiokawa et al. | 375/341 |
| 5,796,693 * | 8/1998 | Taguchi et al. | 369/59 |
| 5,799,046 * | 8/1998 | Hayashi | 375/341 |
| 5,812,334 * | 9/1998 | Behrens et al. | 360/40 |
| 5,916,315 * | 6/1999 | Ryan | 714/786 |
| 5,931,966 * | 8/1999 | Carley | 714/795 |
| 5,938,791 * | 8/1999 | Narahara | 714/795 |
| 5,961,658 * | 10/1999 | Reed et al. | 714/746 |
| 6,014,356 * | 1/2000 | Itoi | 369/59 |

FOREIGN PATENT DOCUMENTS 6-243598 * 2/1994 (JP) .

OTHER PUBLICATIONS

U.S. application No. 09/072,505, filed May 4, 1998
U.S. application No. 09/059,477, filed Apr. 13, 1998.
U.S. application No. 09/066,190, filed Apr. 24, 1998.
Shung et al., "A 30–MHz Trellis Codec Chip for Partial–Response Channels", IEEE Journal of Solid–State Circuits, vol. 26, No. 12, Dec. 1991, pp. 1981–1987, Sep. 1992.*
Sugawara et al., "Viterbi Detector Including PRML and EPRML", IEEE Trans. on Magnetics, vol. 29, No. 6, No. 1993, pp. 4021–4023, Nov. 1993.*
Kobayashi et al., "Simplified EPRML Methods based on Selective ACS for High–Density Magnetic Recording Channels", Globecom '95, pp. 564–570, Dec. 1995.*
Nair et al., "Equalization and Detection in Storage Channels", IEEE Trans. on Magnetics, vol. 32, No. 5, Sep. 1996, pp. 5206–5217.*
Altarriba et al., "An Architecture for High–Order, Variable Polynomial Analog Viterbi Detectors", 40th Midwest Symposium on Circuits and Systems, Aug. 3–6, 1997, pp. 268–271.*

* cited by examiner

Primary Examiner—Stephen M. Baker
(74) Attorney, Agent, or Firm—Limbach & Limbach, LLP

(57) ABSTRACT

In a Viterbi decoder, an SMU is used instead of a PMU. The SMU has four status memories that process a status data value composed of a plurality of bits that represent a status at a time. The status memories generate a sequence of four status data values. A merge block generates decoded data corresponding to the four status data values, detects mismatches of four status data values, and generates a mismatch detection signal NM. The number of mismatches is counted corresponding to the mismatch detecting signal NM. The quality of decoded data and reproduced signal are evaluated corresponding to the count value.

19 Claims, 20 Drawing Sheets

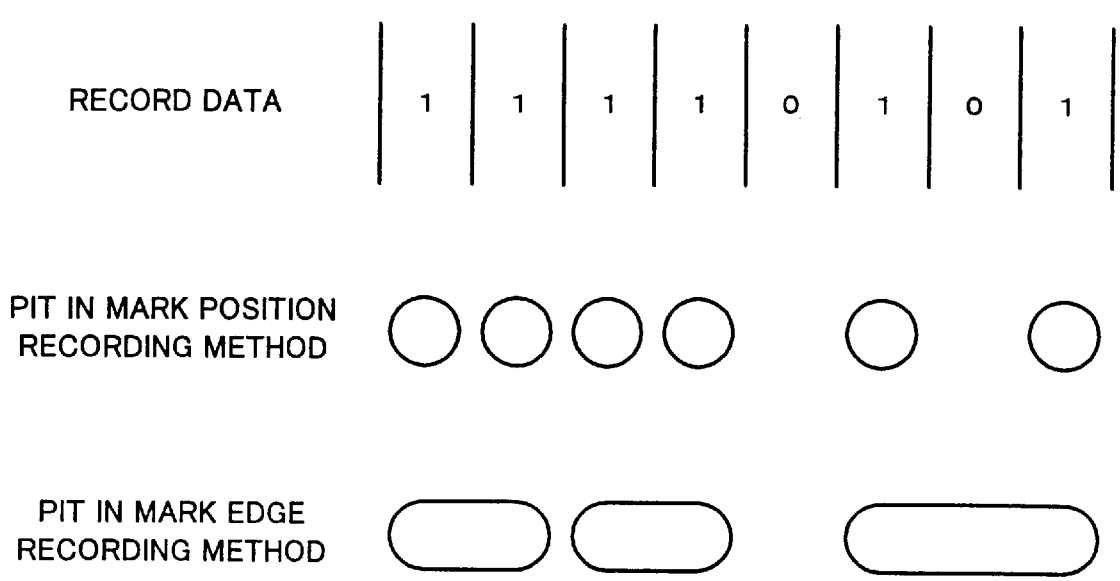

Fig. 4
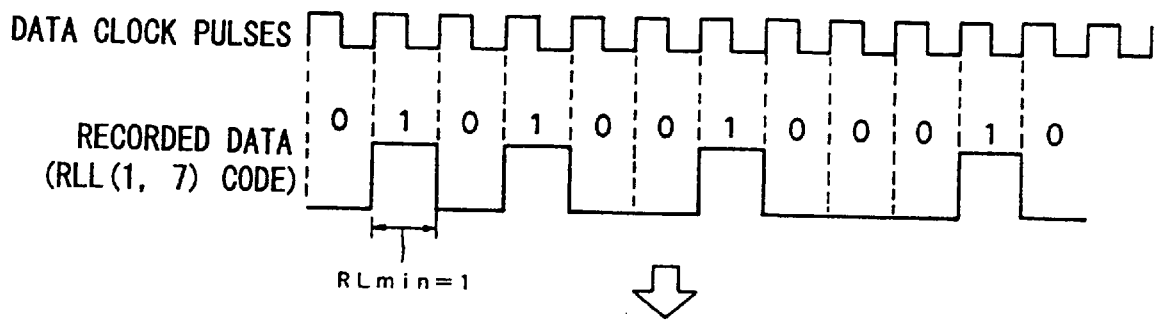
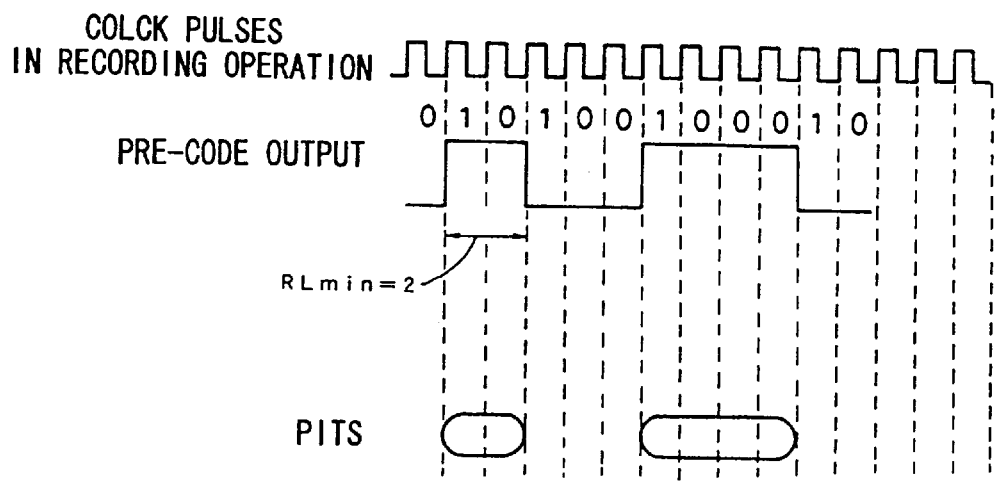

Fig. 9

| | |
|---|---|
| S3 ○ → ○<br>S2 ○ → ○ | $m(0, k-1)+z[k] < m(3, k-1)+\alpha *z[k]-\beta$<br>&& $m(2, k-1)-z[k] < m(1, k-1)-\alpha *z[k]-\beta$ |
| S1 ○ → ○<br>S0 ○ → ○ | $m(0, k) = m(0, k-1)+z[k]$<br>$m(1, k) = m(0, k-1)+\alpha *z[k]-\beta$<br>$m(2, k) = m(2, k-1)-z[k]$<br>$m(3, k) = m(2, k-1)-\alpha *z[k]-\beta$ |
| S3 ○ → ○<br>S2 ○ → ○ | $m(0, k-1)+z[k] \geq m(3, k-1)+\alpha *z[k]-\beta$<br>&& $m(2, k-1)-z[k] < m(1, k-1)-\alpha *z[k]-\beta$ |
| S1 ○ → ○<br>S0 ○ → ○ | $m(0, k) = m(3, k-1)+\alpha *z[k]-\beta$<br>$m(1, k) = m(0, k-1)+\alpha *z[k]-\beta$<br>$m(2, k) = m(2, k-1)-z[k]$<br>$m(3, k) = m(2, k-1)-\alpha *z[k]-\beta$ |
| S3 ○ → ○<br>S2 ○ → ○ | $m(0, k-1)+z[k] < m(3, k-1)+\alpha *z[k]-\beta$<br>&& $m(2, k-1)-z[k] \geq m(1, k-1)-\alpha *z[k]-\beta$ |
| S1 ○ → ○<br>S0 ○ → ○ | $m(0, k) = m(0, k-1)+z[k]$<br>$m(1, k) = m(0, k-1)+\alpha *z[k]-\beta$<br>$m(2, k) = m(1, k-1)-\alpha *z[k]-\beta$<br>$m(3, k) = m(2, k-1)-\alpha *z[k]-\beta$ |
| S3 ○ → ○<br>S2 ○ → ○ | $m(0, k-1)+z[k] \geq m(3, k-1)+\alpha *z[k]-\beta$<br>&& $m(2, k-1)-z[k] \geq m(1, k-1)-\alpha *z[k]-\beta$ |
| S1 ○ → ○<br>S0 ○ → ○ | $m(0, k) = m(3, k-1)+\alpha *z[k]-\beta$<br>$m(1, k) = m(0, k-1)+\alpha *z[k]-\beta$<br>$m(2, k) = m(1, k-1)-\alpha *z[k]-\beta$<br>$m(3, k) = m(2, k-1)-\alpha *z[k]-\beta$ |

Fig. 22

| MS | VM |
|---|---|
| 0 0 | VM00 |
| 0 1 | VM01 |
| 1 1 | VM11 |
| 1 0 | VM10 |

Fig. 23

| VMD | VM | DECODED DATA VALUE |
|---|---|---|
| 0 0 | 0 0<br>0 1 | 0<br>1 |
| 0 1 | 1 1 | 0 |
| 1 1 | 1 1<br>1 0 | 0<br>1 |
| 1 0 | 0 0 | 0 |

INFORMATION REPRODUCING APPARATUS AND REPRODUCING METHOD

BACKGROUND OF THE INVENTION

1. Field of the Invention

The present invention relates to an information reproducing apparatus such as a magneto-optic disc apparatus, in particular, to an information reproducing apparatus using PRML (Partial Response Maximum Likelihood) method and a reproducing method thereof.

2. Description of the Related Art

In an information reproducing apparatus such as a magneto-optic disc apparatus, as a method for decoding a signal reproduced from a record medium, Viterbi decoding method has been widely used. The Viterbi decoding method is a decoding method for decreasing a bit error rate that takes place in decoding a reproduced signal having a white noise.

Next, an outline of the Viterbi decoding method will be described. A plurality of statuses corresponding to a recording method for a record medium are identified beforehand. The maximum likelihood transition among such statuses is selected by a calculating process corresponding to a signal reproduced from a record medium. Such maximum likelihood transition is selected by an ACS (Adding, Comparing, and Selecting circuit) of a Viterbi decoder. The ACS estimates the maximum likelihood status transition from status transitions equal to the number of statuses. A PMU (Path Memory Unit) that has path memories equal to the number of statuses is disposed on the next stage of the ACS. The PMU generates decoded data as a sequence of decoded data values "1" or "0" corresponding to status transitions equal to the number of statuses from which the ACS estimates the maximum likelihood status transition.

The status transitions equal the number of statuses from which the ACS estimates the maximum likelihood status transition match each other. However, when the quality of a reproduced signal is not good, the status transitions may not match. When they do not match, a settled status transition cannot be obtained. Decoded data that path memories of the PMU generate corresponding to the settled status transition does not match and the reliability thereof is low.

Conventionally, since the ACS cannot recognize status transitions from which it estimates the maximum likelihood status transition, a process corresponding to matches/mismatches of decoded data equal to the number of statuses that are output from the PMU is performed. In other words, assuming that decoded data always matches, decoded data that is output from one of path memories is supplied to the next stage. Alternatively, decoded data that is determined as the most adequate decoded data by the rule of majority is selected from decoded data that is output from all the path memories and the selected decoded data is supplied to the next stage.

In the conventional Viterbi decoder, decoded data corresponding to a status transition is generated. However, since status data that represents the status transition itself is not generated. Thus, the maximum likelihood status transition estimated by the ACS is not recognized. Consequently, it is impossible to evaluate the reliability of decoded data and the signal quality of a reproduced signal corresponding to the maximum likelihood status transition estimated by the ACS.

As described above, the reliability of decoded data should be evaluated depending on whether the status transitions equal to the number of statuses from which the ACS actually estimates the maximum likelihood status transition match each other (namely, whether or not a settled status transition is obtained). To perform such an evaluation, status data that represents status transitions should be generated.

OBJECTS AND SUMMARY OF THE INVENTION

Therefore, an object of the present invention is to provide an information reproducing apparatus that generates status data that represents the maximum likelihood status transition selected by a calculating process corresponding to a reproduced signal value in Viterbi decoding method, generates decoded data corresponding to the generated status data, and evaluates the reliability of the decoded data and the signal quality of the reproduced signal corresponding to the status data and to provide a reproducing method thereof.

According to the present invention, there is provided an information reproducing apparatus for reproducing data that has been RLL (Run Length Limited) encoded and recorded on a record medium corresponding to Viterbi decoding method, comprising branch metric calculating means for calculating branch metrics for all statuses at a particular time point corresponding to an input reproduced signal, path metric updating means for selecting the maximum likelihood path metric of each of the statuses corresponding to values of which the branch metrics and the preceding path metrics are added, for outputting a first selection signal corresponding to the selected result, and for outputting a second selection signal corresponding to the minimum values of the path metrics, status data generating means, having a plurality of status memories corresponding to the respective statuses, for updating status data that represents the statuses corresponding to the first selection signal, status data selecting means for selecting the most adequate status data from the status data stored in the status memories corresponding to the second selection signal and for outputting the selected status data, and data decoding means for outputting decoded data corresponding to the selected status data and the just preceding status data.

According to the present invention, there is provided a many-value many-status Viterbi decoding apparatus for use with four-value four-status Viterbi decoding method with a waveform equalizing characteristic of PR(B, 2A, B), comprising an ACS circuit having adding devices for adding branch metrics of individual statuses and past path metrics, a comparing and selecting device for comparing output data of the adding devices and selecting the maximum likelihood path metric, and a storing circuit for storing the selected path metric, a status memory circuit, having a plurality of status memories corresponding to the individual statuses, for generating status data that represents a status transition corresponding to the selected path metric, and a selecting circuit for selecting one of the status data stored in the status memories and outputting the selected status data.

According to the present invention, there is provided a many-value many-status Viterbi decoding method with a waveform equalizing characteristic of PR(B, 2A, B), comprising the steps of (a) selecting a path metric with the minimum value from statuses corresponding to values of which branch metrics of the individual statuses and past path metrics are added, (b) storing transitions of the individual statuses selected as status data corresponding to the selected path metric, and (c) selecting the most adequate status data from the stored status data and outputting the selected status data.

The above, and other, objects, features and advantage of the present invention will become readily apparent from the following detailed description thereof which is to be read in connection with the accompanying drawings.

BRIEF DESCRIPTION OF THE DRAWINGS

FIG. 2 is a schematic diagram for explaining a mark position recording method and a mark edge recording method;

FIG. 9 is a schematic diagram showing a condition of a status transition corresponding to a standardized metric in the four-value four-status Viterbi decoding method;

FIG. 22 is a schematic diagram showing an example of a matrix referenced for status data values to be selected in the merge block shown in FIG. 21; and FIG. 23 is a schematic diagram showing an example of a matrix referenced for decoded data in the merge block shown in FIG. 21.

DETAILED DESCRIPTION OF THE PREFERRED EMBODIMENTS

For easy understanding of the present invention, as an example of a recording/reproducing apparatus having a reproducing system corresponding to Viterbi decoding method, the overall structure of the apparatus, the sector format of a record medium, an outline of a four-value four-status Viterbi decoding method, the structure and operation of a Viterbi decoder that accomplishes the four-value four-status Viterbi decoding method, and another Viterbi decoding method other than the four-value four-status Viterbi decoding method will be described one after the other.

Outline of Disc Recording/Reproducing Apparatus

Figure 1:
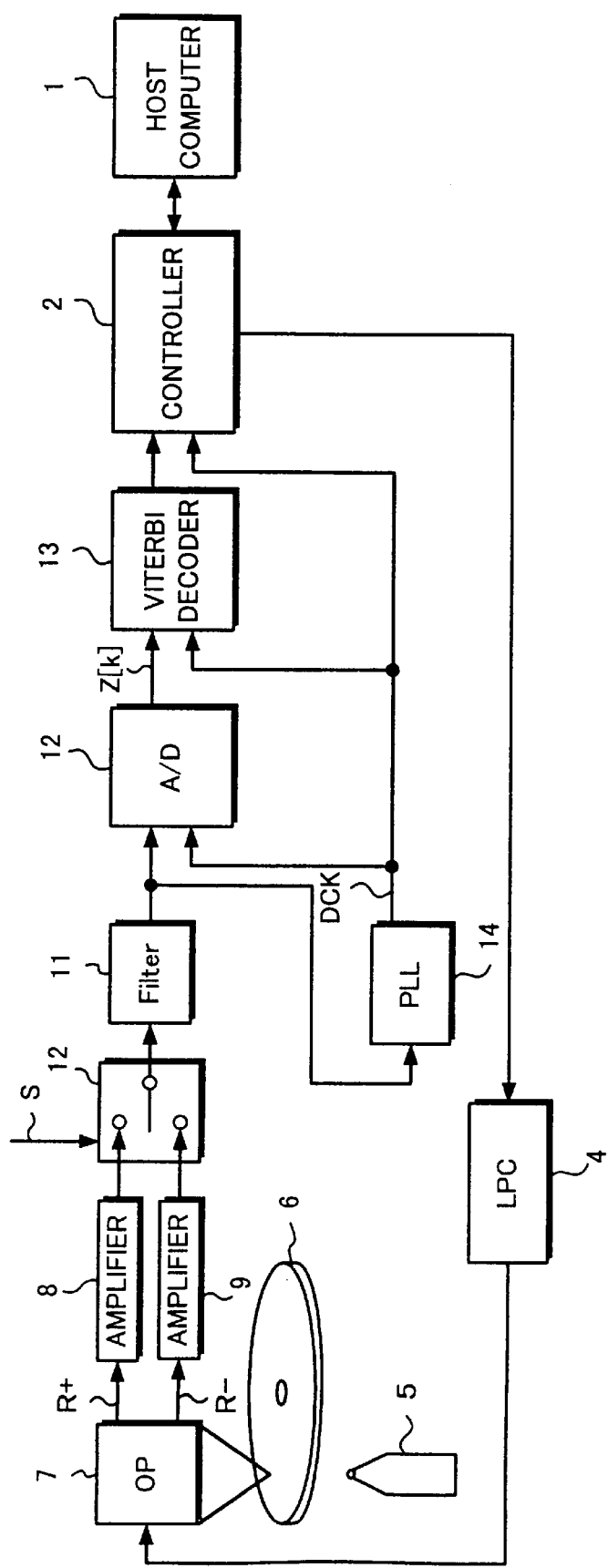
FIG. 1 is a block diagram showing the overall structure of an example of a magneto-optic disc apparatus that performs four-value four-status Viterbi decoding method.

Next, an example of a recording/reproducing apparatus having a reproducing system corresponding to the Viterbi decoding method will be described. FIG. 1 is a block diagram showing the overall structure of a magneto-optic disc apparatus having a reproducing system corresponding to the Viterbi decoding method. When a recording operation is performed, a controller 2 receives user data to be recorded corresponding to a command issued by a host computer 1 and encodes the user data as information words to RLL(1, 7) code as code words. The code words are supplied as record data to a laser power controlling portion (LPC) 4. In addition, the controller 2 performs a decoding process (that will be described later), controlling processes for a recording mode, a reproducing mode, and an erasing mode, and a communication operation with the host computer 1.

The LPC 4 controls a laser power of an optical pickup 7 corresponding to the supplied record data so as to form a pit sequence with magnetic polarities on a magneto-optic disc 6. When the data is recorded, a magnetic head 5 applies a bias magnetic field to the magneto-optic disc 6. Actually, the data is recorded in a mark edge recoding method corresponding to a pre-code output (that will be described later) generated corresponding thereto.

As will be described later, a record position (namely, a pit position) is controlled by a particular means (not shown) that aligns the magnetic head 5 and the optical pickup 7. Thus, in the recording mode, when the optical pickup 7 passes an address portion, the similar operation is performed as with the reproducing mode.

Next, with reference to FIG. 2, a method for causing each pit formed in the above-described manner to correspond to each bit of a pre-code generated corresponding to record data will be described. A recording method of which "0" or "1" of a pre-code represents the presence or absence of a pit formed on a record medium is referred to as mark position recording method. On the other, a recording method of which the inversion of the polarity at the boundary of each bit of a pre-code represents "1" is referred to as mark edge recording method. When a signal is reproduced, the boundary of each bit of a reproduced signal is recognized corresponding to a read clock pulse DCK (that will be described later).

Next, the structure and operation of the reproducing system will be described. The optical pickup 7 radiates laser light to the magneto-optic disc 6, receives the reflected light thereof, and reproduces a signal corresponding to the reflected light. The reproduced signal is composed of four signals that are a sum signal $R_+$, a difference signal $R_-$, a focus error signal, and a tracking error signal (the focus error signal and the tracking error signals are not shown). The sum signal $R_+$ is supplied to an amplifier 8. The amplifier 8 adjusts for example the gain of the sum signal $R_+$. The resultant sum signal $R_+$ is supplied to a selection switch 10. On the other hand, the difference signal $R_-$ is supplied to an amplifier 9. The amplifier 9 for example adjusts the gain of the difference signal $R_-$. The resultant difference signal $R_-$ is supplied to the selection switch 10. The focus error signal is supplied to a means (not shown) that removes a focus error. The tracking error signal is supplied to a servo system (not shown).

A selection signal S (that will be described later) is supplied to the selection switch 10. The selection switch 10 supplies the sum signal $R_+$ or the difference signal $R_-$ to a filter portion 11 corresponding to the selection signal S. In other words, corresponding to a sector format of the magneto-optic disc 6, while a signal reproduced from an embossed portion is being supplied to the selection switch 10, the sum signal $R_+$ is supplied to the filter portion 11. While a signal reproduced from a magneto-optically recorded portion is being supplied to the selection switch 10, the difference signal $R_-$ is supplied to the filter portion 11.

The selection signal S is generated in the following manner. A signal that is reproduced from a predetermined pattern defined in a sector format is detected from the reproduced signal. An example of the predetermined pattern is a sector mark SM (that will be described later). When such a signal is detected, by counting the number of read clock pulses, the selection signal is generated.

The filter portion 11 is composed of a low pass filter that does not pass a noise component and a waveform equalizer that equalizes the waveform of a signal. As will be described later, the waveform equalizing characteristic in the waveform equalizing process corresponds to Viterbi decoding method of a Viterbi decoder 13. An A/D converter 12 that receives an output signal of the filter portion 11 samples a reproduced signal value $z[k]$ corresponding to the read clock pulses DCK (that will be described later). The Viterbi decoder 13 generates decoded data with a reproduced signal value $z[k]$ corresponding to the Viterbi decoding method. The decoded data is the maximum likelihood decoded data sequence of the recorded data. Thus, when there is no error in decoded data, the decoded data accords with the recorded data.

The decoded data is supplied to the controller 2. As described above, the recorded data is code words of which user data has been encoded by a channel-encoding process. Thus, when the error rate of decoded data is sufficiently low, the decoded data can be treated as recorded data as code words. The controller 2 performs the decoding process corresponding to the channel-encoding process for the decoded data and reproduces the user data and so forth.

Output data of the filter portion 11 is also supplied to a PLL portion 14. The PLL portion 14 generates the read clock pulses DCK corresponding to the signal received from the filter portion 11. The read clock pulses SCK are sent to the controller 2, the A/D converter 12, the Viterbi decoder 13, and so forth. The controller 2, the A/D converter 12, and the Viterbi decoder 13 operate corresponding to the read clock pulses DCK. In addition, the lead clock pulses DCK are supplied to a timing generator (not shown). The timing generator generates a signal that controls the operation timing of the apparatus such as the switching operation between the recording operation and the reproducing operation.

In the above-described reproducing operation, the operations of the individual structural portions of the reproducing system are adapted so as to obtain correct reproduced data corresponding to the signal reproduced from the magneto-optic disc 6. Such an operation is referred to as calibration. The calibration is performed for adapting parameters of the reproducing system because the quality of a reproduced signal varies corresponding to the characteristics of a record medium (such as machining accuracy), the fluctuation of the power of recording laser light, and the recording/reproducing conditions (such as ambient temperature).

The calibration includes an adjustment of the power of reading laser light of the optical pickup 7, adjustments of the gains of the amplifiers 8 and 9, an adjustment of the waveform equalizing characteristics of the filter portion 11, and adjustments of amplitude reference values of the Viterbi decoder 13. The calibration is performed by a structure not shown in FIG. 1 just after the power of the apparatus is turned on or when a record medium is replaced with another one.

Outline of Sector Format of Record Medium

Figure 3A:
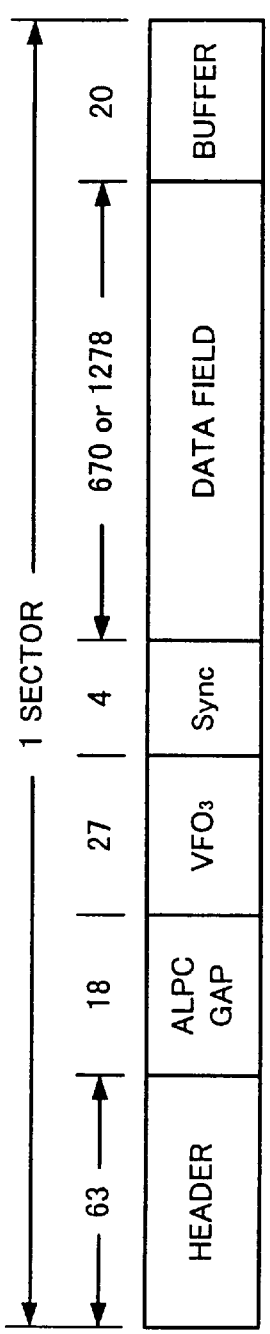
FIGS. 3A to 3C are schematic diagrams for explaining an example of a sector format of a magneto-optic disc.

User data as sectors that are recording/reproducing data units are recorded on the magneto-optic disc 6. Next, with reference to FIG. 3, an example of the sector format of the magneto-optic disc 6 will be described. As shown in FIG. 3A, one sector has areas of a header, an ALPC, a gap, a $VFO_3$, a sync, a data field, and a buffer. In FIG. 3, numerals in individual areas represent bytes of data. Data that has been encoded by block encoding method is recorded on the magneto-optic disc 6. For example, data of eight bits is converted into data of 12 channel bits and recorded.

For example, there are two types of sector formats that are 1024-byte format and 512-byte format as the amount of user data. In the 1024-byte format, the number of bytes in the data field is 670 bytes. In the 512-byte format, the number of bytes in the data filed is 1278 bytes. The pre-formatted header (63 bytes) and the ALPC and gap area (18 bytes) in the 1024-byte format are the same as those in the 512-byte format.

Figure 3B:
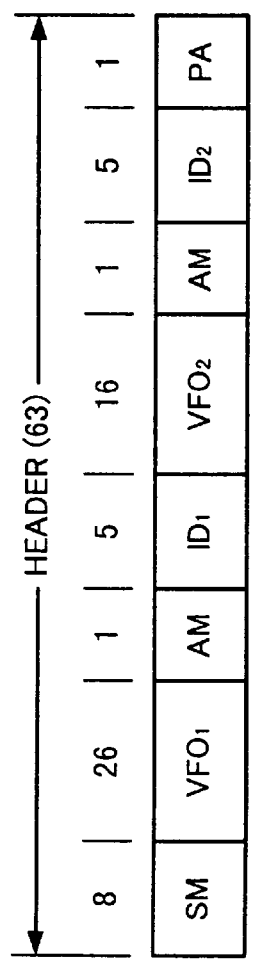

FIG. 3B shows the header composed of 63 bytes. The header has a sector mark SM (8 bytes), a $VFO_1$ (26 bytes) of a VFO field, an address mark AM (1 byte), an $ID_1$ (5 bytes) of an ID field, a $VFO_2$ (16 bytes) of the VFO field, an address mark AM (1 byte), an $ID_2$ (5 bytes) of the ID field, and a post-amble PA (1 byte).

Figure 3C:
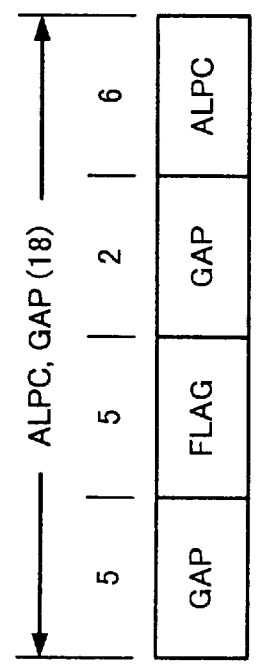

FIG. 3C shows the ALPC and gap area composed of 18 bytes. The ALPC and gap area has a gap field (5 bytes), a flag field (5 bytes), a gap field (2 bytes), and an ALPC (6 bytes).

Next, these fields will be described. The sector mark SM identifies the beginning of a sector. The sector mark SM has an embossed pattern that does not take place in the RLL(1, 7) code. The VFO field synchronizes with a VFO (Variable Frequency Oscillator) of the PLL portion 18. The VFO field is composed of the $VFO_1$, the $VFO_2$, and the $VFO_3$. $VFO_1$ and $VFO_3$ are embossed. The $VFO_3$ are magneto-optically written when the recording operation is performed for a relevant sector. The $VFO_1$, the $VFO_2$, and the $VFO_3$ have patterns of which channel bits "0" and "1" alternately take place. These patterns are referred to as 2T patterns. Thus, assuming that the time period of one channel bit is denoted by T, when the VFO field is reproduced, a signal of which the level is inverted at intervals of 2T is obtained.

The address mark AM is used to synchronize with the next ID field for each byte. The address mark AM has an embossed pattern that does not take place in the RLL(1, 7) code. The ID field has the address of a relevant sector (namely, information of a track number and a sector number) and a CRC byte for detecting an error thereof. The ID field is composed of five bytes. With the $ID_1$ and $ID_2$, the same address information is redundantly recorded. The post amble PA has a pattern of which channel bits "0" and "1" alternately take place (namely, a 2T pattern). The $ID_1$, $ID_2$, and the post amble PA are embossed. Thus, the header area is a pre-formed area of which pits have been embossed.

FIG. 3C shows the gap area. In the gap area, pits are not formed. The first gap field (5 bytes) is a field just preceded by the pre-formatted header. The first gap field is used to assure the time period that the apparatus requires to process the header. The second gap field (2 bytes) is used to absorb the deviation of the position of the $VFO_3$.

In the ALPC and gap area, a flag field of five bytes is recorded. When data of a relevant sector is recorded, 2T patterns are successively recorded in the flag field. The ALPC (Auto Laser Power Control) field is disposed to test the laser power in the recording mode. A sync field (4 bytes) is used to cause the apparatus to synchronize with the next data field for each byte.

The data field is used to record user data. The data field of 670 bytes has user data (512 bytes), an error detection/correction parity (144 bytes), a sector write flag (12 bytes), and two bytes (FF). On the other hand, the data field of 1278 bytes has user data (1024 bytes), an error detection/correction parity (242 bytes), and a sector write flag (12 bytes). The buffer field at the last of the sector is used as a tolerance for an electric/mechanical error.

In the above-described sector formats, the header is an area of which pits are embossed. The ALPC and the gap area are not used in the reproducing operation. The $VFO_3$, the sync field, and the data field are data areas that have been magneto-optically recorded.

Outline of Four-value Four-status Viterbi Decoding Method

Next, the Viterbi decoding method of the Viterbi decoder 13 will be described. As described above, user data is converted into code words as recorded data by various encoding methods. A proper encoding method is used corresponding to the characteristic of a record medium and a recording/reproducing method. In the magneto-optic disc apparatus, in a block encoding process, RLL (Run Length Limited) encoding method that limits the run length (namely, the number of "0"s between "1" and "1") has been widely used. There are several RLL encoding methods. Generally, m/n block code of which the number of "0"s between "1" and "1" is at least d and at most k is referred to as RLL(d, k; m, n) code.

For example, with the 2/3 block code, the block encoding method of which the number of "0"s between "1" and "1" is at least one and at most seven is RLL(1, 7; 2, 3) code. Generally, the RLL(1, 7; 2, 3) code is sometimes referred as to RLL(1, 7) code. Thus, in the following description, RLL(1, 7) code represents RLL(1, 7; 2, 3) code.

To decode a signal reproduced from data that has been recorded by a combination of the RLL encoding method and the mark edge recording method, the Viterbi decoding method can be used.

The RLL encoding method satisfies the conditions required for the encoding method from two view points of the improvement of the record density and the stability of the reproducing operation. As described above, in the mark edge recording method, since "1" of a pre-code generated with recorded data corresponds to the inversion of the polarity represented by an edge of each pit, as the number of "0"s between "1" and "1" is large, the number of bits recorded in each pit can be increased. Thus, the record density can be increased.

On the other hand, the read clock pulses DCK that cause the operations of the structural portions of the reproducing system to match are generated by the PLL portion 14 corresponding to a reproduced signal. Thus, as the number of "0"s between "1" and "1" is large, in the reproducing operation, the PLL portion unstably operates. Thus, the entire reproducing operation becomes unstable.

Considering such two conditions, the number of "0"s between "1" and "1" should be in a proper range. For the number of "0"s in recorded data, the RLL encoding method is effective.

Figure 4:
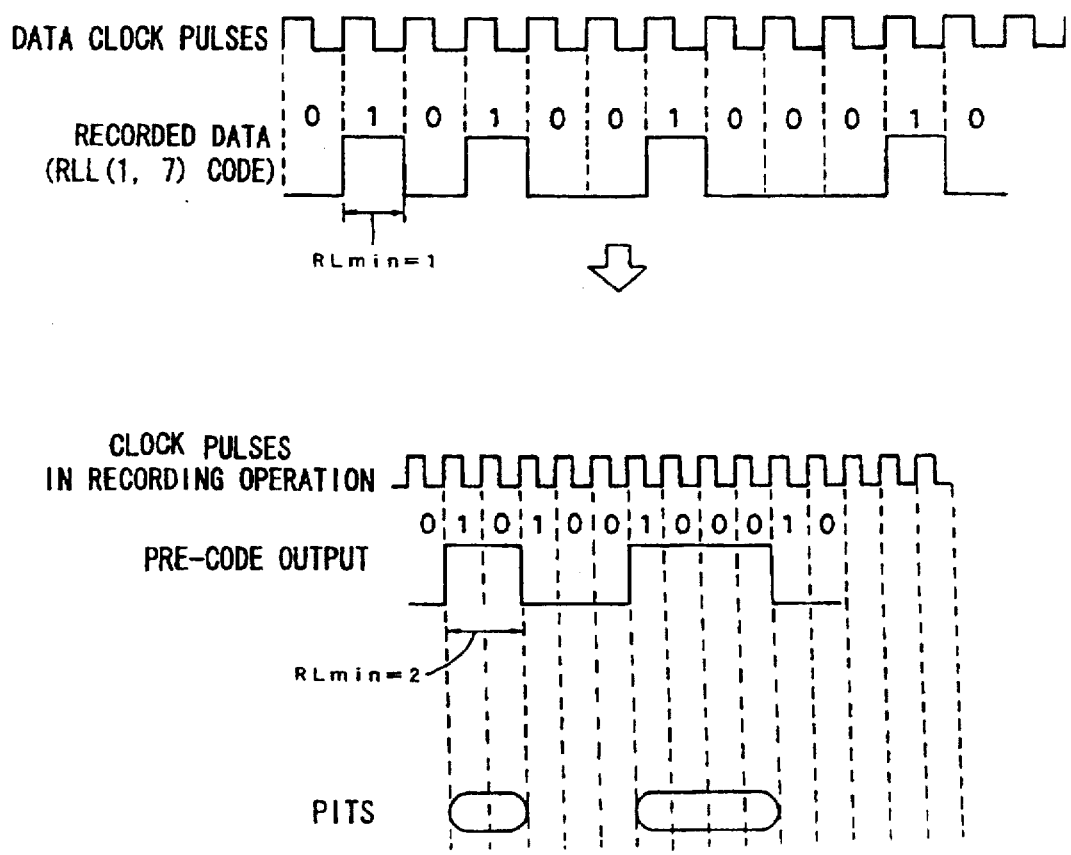
FIG. 4 is a schematic diagram showing that the minimum magnetizing inversion width is 2 in RLL(1, 7) code encoding method.

As shown in FIG. 4, in the combination of the RLL(1, 7) encoding method and the mark edge recording method, at least one "0" is present between "1" and "1" of a pre-code generated corresponding to record data. Thus, the minimum inversion width is 2. When the encoding method whose minimum inversion width is 2 is used, as a method for reproducing recorded data from a reproduced signal that have been affected by inter-code interference and noise, four-value four-status Viterbi decoding method (that will be described later) can be used.

As described above, the filter portion 11 performs the waveform equalizing process for a reproduced signal. In the waveform equalizing process performed on the preceding stage of the Viterbi decoding process, partial response process that actively uses inter-code interference is used. The waveform equalizing characteristic is obtained in consideration of the linear record density of the recording/reproducing system and the MTF (Modulation Transfer Function) of the partial response characteristics expressed by $(1+D)^n$. The waveform equalizing process using PR(1, 2, 1) code for data recorded in the combination of the RLL(1, 7) encoding method and the mark edge recording method is disposed on the preceding stage of the four-value four-status Viterbi decoding method.

On the other hand, in the mark edge recording method, before data is recorded on a magneto-optic disc medium or the like, a pre-code is generated corresponding to the recorded data encoded by the RLL encoding process or the like. Assuming that the record data sequence at each time point k is denoted by a[k] and a pre-code thereof is denoted by b[k], the pre-code is generated as follows.

$$b[k] = \mod 2 \ \{a[k]+b[k-1]\} \tag{1}$$

The pre-code b[k] is actually recorded on a magneto-optic disc medium or the like. Next, the waveform equalizing process with a waveform equalizing characteristic PR(1, 2, 1) performed by the waveform equalizer of the filter portion 11 will be described. However, in the following description, it is assumed that the amplitude of a signal is not standardized and that the waveform equalizing characteristic is denoted by PR(B, 2A, B). In addition, the value of a reproduced signal that does not consider noise is denoted by c[k]. A really reproduced signal that includes noise (namely, a signal reproduced from a record medium) is denoted by z[k].

With the waveform equalizing characteristic PR(B, 2A, B), the contribution of the amplitude at a time point k is 2A times as large as the value of the reproduced signal at the time point k. In addition, the contribution of the amplitude at the time point k−1 or k+1 is B times as large as the value of the reproduced signal at the time point k−1 or k+1. Thus, with the maximum value of the value of the reproduced signal, pulses are detected at time points k−1, k, and k+1. In this case, the maximum value of the reproduced signal is expressed as follows.

$B+2A+B=2A+2B$

The minimum value of the reproduced signal is 0. However, actually, as c[k], A+B of DC component is subtracted as follows.

$$c[k]=B\times b[k-2]+2A\times b[k-1]+B\times b[k]-A-B \qquad (2)$$

Figure 5:
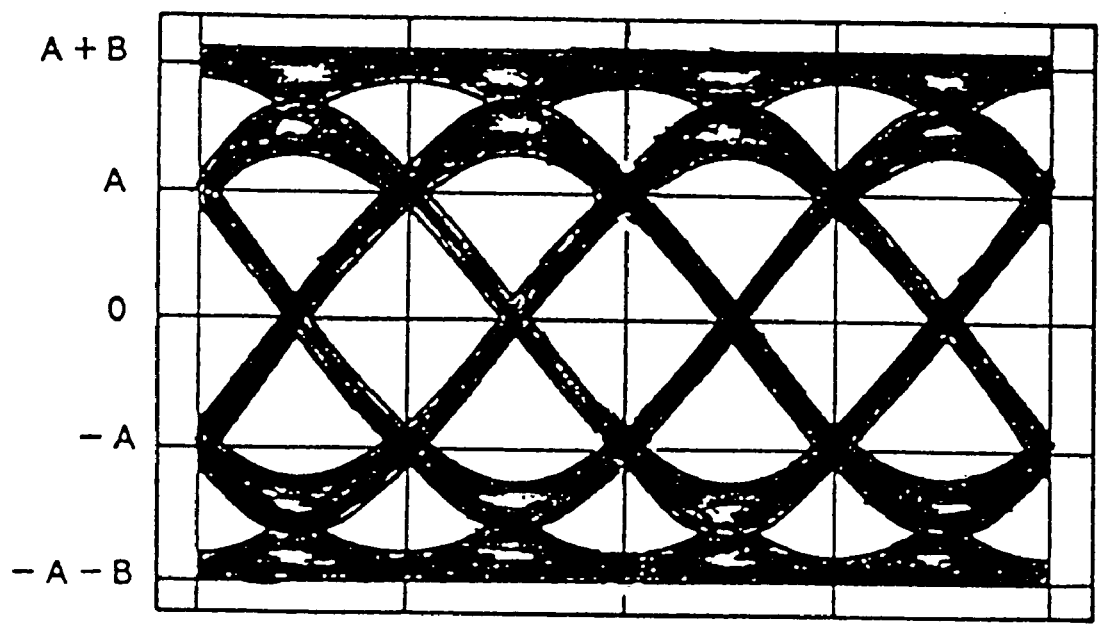
FIG. 5 is a schematic diagram for explaining an eye pattern in the case that a signal reproduced from data that has been recorded in a combination of RLL(1, 7) code encoding method and mark edge recording method is waveform-equalized with partial response characteristic PR(1, 2, 1)

Thus, the reproduced signal c[k] that does not consider noise is one of A+B, A, −A, or −A−B. Generally, as one of methods that represent the characteristic of a reproduced signal, reproduced signals at for example five time points are superimposed. The resultant signal is referred to as eye pattern. FIG. 5 shows an example of an eye pattern of a reproduced signal z[k] of which the magneto-optic disc apparatus according to the present invention has performed the waveform equalizing process with the waveform equalizing characteristic PR(B, 2A, B). FIG. 5 shows that the value of the reproduced signal z[k] at each time point deviates due to noise. However, from FIG. 5 it is clear that the value is one of A+B, A, −A, and −A−B. As will be described later, A+B, A, −A, and −A−B can be used as identification points.

Figure 7:
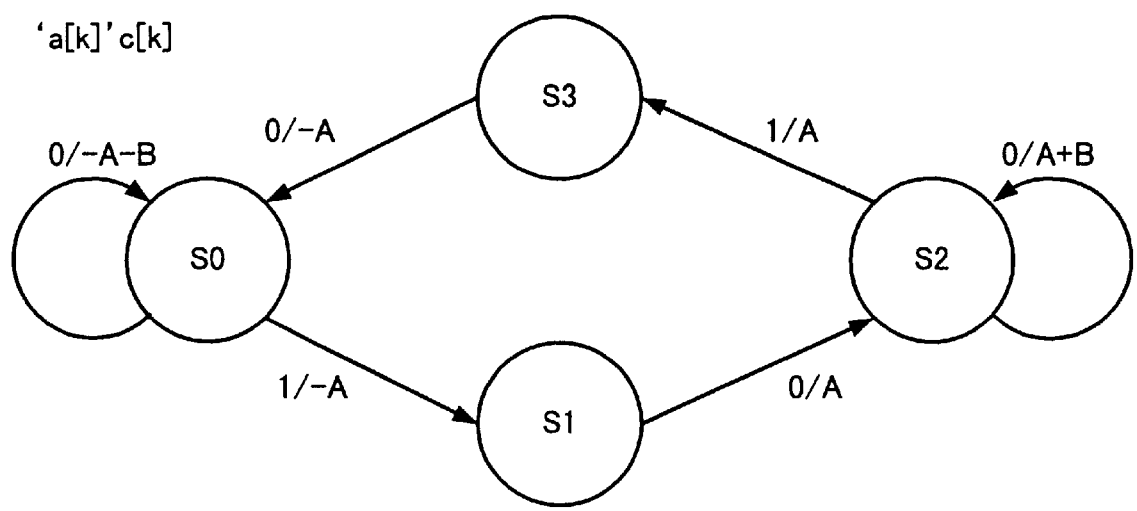
FIG. 7 is a schematic diagram showing an example of a status transition diagram of the four-value four-status Viterbi decoding method.

Next, the Viterbi decoding method for decoding a reproduced signal of which the above-described waveform equalizing process has been performed will be described. At step (1), all possible statuses corresponding to the encoding method and the record medium are obtained. At step (2), starting from each status at a particular time point, all possible status transitions at the next time point, record data a[k] of each status transition, and the value c[k] of the reproduced signal are obtained. A diagram that represents all the statuses and status transitions obtained at steps (1) and (2) and [value a[k] of record data/value c[k] of reproduced signal] in each status transition is referred to as status transition diagram. FIG. 7 shows a status transition diagram in the four-value four-status Viterbi decoding method. The Viterbi decoder 13 is structured so that it performs the decoding operation corresponding to the status transition diagram.

At step (3), based on the status transition diagram, the maximum likelihood status transition corresponding to the signal z[k] reproduced at each time point k from the record medium is selected. However, as described above, the signal z[k] has been waveform-equalized on the preceding stage of the Viterbi decoder 13. Whenever the maximum likelihood status transition is selected, the value of the recorded data a[k] in the status transition diagram is treated as a decoded value. Thus, decoded data a'[k] as the maximum likelihood decoded value sequence to the recorded data can be obtained. However, the maximum likelihood decoded value sequence is obtained from the decoded data value at each time point k is obtained by a PMU 23 of the Viterbi decoder 13. Thus, as described above, when there is no error in decoded data, the decoded data sequence a'[k] matches the recorded data sequence a[k]. Next, step (1) to (3) will be described in detail.

At step (1), a status at a time point k is defined with pre-codes at the time point k and earlier time points as follows. In other words, the status of which n=b[k], m=b[k−1], and 1=b[k−2] is defined as Snml. In this definition, it is considered that there are $2^3=8$ statuses. As described above, statuses that actually take place are restricted by the encoding method and so forth. In the recorded data sequence a[k] encoded with RLL(1, 7) code, since there is at least one "0" between "1" and "1", two or more "1"s do not succeed. A particular condition is applied to a pre-code b[k] corresponding to the conditions of the recorded data sequence a[k]. Thus, the resultant statuses are restricted.

Next, such a restriction will be practically described. As was described, a recorded data sequence that has been encoded with RLL(1, 7) does not include two or more "1"s that succeed. In other words, the following values do not take place.

$$a[k]=1, a[k-1]=1, a[k-2]=1 \qquad (3)$$

$$a[k]=1, a[k-1]=1, a[k-2]=0 \qquad (4)$$

$$a[k]=0, a[k-1]=1, a[k-2]=1 \qquad (5)$$

Corresponding to such a condition for the recorded data sequence, as a condition for b[k] corresponding to Formula (1), it is clear that two statuses S010 and S101 do not take place. Thus, the number of possible statuses is $2^3-2=6$.

Next, at step (2), starting from a status at a particular time point j, to obtain statuses at the next time point j+1, the cases of which the value a[j+1] of recorded data at the time point j+1 is 1 and 0 should be considered.

In this example, the status S000 is considered. Corresponding to Formula (1), there are two recorded data values pre-coded as the status S000 (namely, n=b[j]=0, l=b[j−1]=0, m=b[j−2]=0) as follows.

$$a[j]=0, a[j-1]=0, a[j-2]=1 \qquad (6)$$

$$a[j]=0, a[j-1]=0, a[j-2]=0 \qquad (7)$$

[when a [j+1]=1]

At this point, corresponding to Formula (1), b[j+1] is calculated as follows.

[0067]

$$\begin{aligned} b[j+1] &= mod\ 2\ \{a[j+1]+b[j]\} \qquad (8) \\ &= mod\ 2\{1+0\} \\ &= 1 \end{aligned}$$

Thus, the value of the reproduced signal c[j] is calculated corresponding to Formula (2) as follows.

[0068]

$$\begin{aligned} c[j+1] &= \{B\times b[j+1]+2A\times b[j]+B\times b[j-1]\} \qquad (9) \\ &= -A-B \\ &= \{B\times 1+2A\times 0+B\times 0\}-A-B \\ &= -A \end{aligned}$$

In addition, in the status Snlm at the next time point j+1, the conditions of n=b[j+1], 1=b[j], and m=b[j−1] are satisfied. As described above, since b[j+1]=1, b[j]=0, and b[j−1]=0, the status at the next time point j+1 is S100. Thus, when a[j+1]=1, a transition S000→S100 takes place.

[when a[j+1]=0]

At this point, corresponding to Formula (1), b[j+1] is calculated as follows.

$$\begin{aligned} b[j+1] &= mod\ 2\ \{a[j+1]+b[j]\} \qquad (10) \\ &= mod2\ \{0+0\} \\ &= 0 \end{aligned}$$

Thus, the value of the reproduced signal c[j+1] is calculated corresponding to Formula (2) as follows.

$$c[j+1] = \{B \times b[j+1] + 2A \times b[j] + B \times b[j-1]\} - A - B \quad (11)$$
$$= \{B \times 0 + 2A \times 0 + B \times 0\} - A - B$$
$$= -A - B$$

In the status Snlm at the next time point j+1, the conditions of n=b[j+1], l=b[j], and m=b[j−1] are satisfied. As described above, since conditions of b[j+1]=0, b[j] =0, and b[j−1]=0 are satisfied, the status at the next time point is S000. Thus, when a[j+1]=0, a transition S000→S000 takes place.

Thus, in each status other than S000 at the time point j, the relation between status transitions starting from the status S000 at the next time point j+1 and recorded data values a[j+1] and reproduced signal values c[j+1] in each of the status transitions can be obtained.

Figure 6:
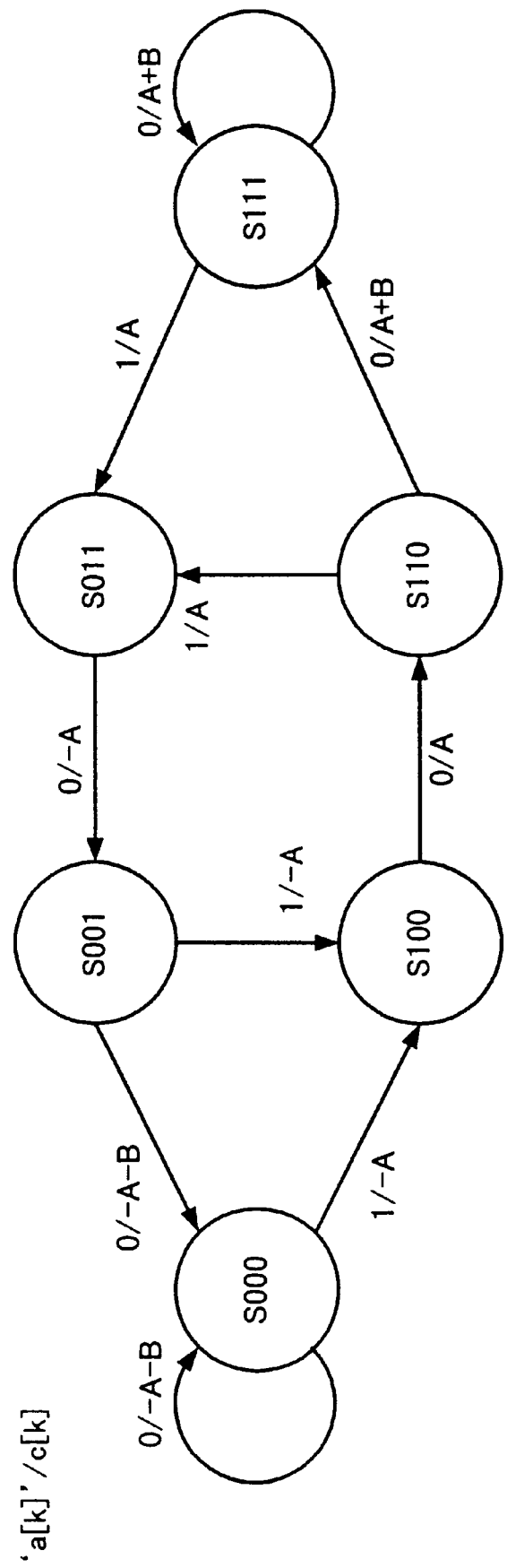
FIG. 6 is a schematic diagram for explaining a process for creating a status transition diagram of the four-value four-status Viterbi decoding method.

The relation between status transitions starting from each status and recorded data values and reproduced signal values in each of the status transitions is represented by a diagram shown in FIG. 6. The time points j and j+1 are not special time points. Thus, the relation between status transitions and recorded data values and reproduced signal values can be applied at any time point. Thus, in FIG. 6, a recorded data value and a reproduced signal value in a status transition at any time point k are denoted by a[k] and c[k], respectively.

In FIG. 6, a status transition is represented by an arrow. A code in association with each arrow represents [recorded data value a[k]/reproduced signal value c[k]]. There are two status transitions starting from each of the statuses S000, S001, S111, and S110. On the other hand, there is one status transition starting from each of the statuses S011 and S100.

In FIG. 6, in the statuses S000 and S001, when the recorded data value a[k] is 1, the reproduced signal value c[k] is −A. In this case, each of the statuses S000 and S001 changes to S100. When the recorded data value a[k] is 0, the reproduced signal value c[k] is −A−B. In this case, each of the statuses S000 and S001 changes to S000. In the statuses S111 and S110, when the recorded data value is a[k+1], the reproduced signal value is c[k+1], In this case, each of the statuses S111 and S110 changes to the same status. Thus, the statuses S000 and S001 are denoted by S0. The statuses S111 and S110 are denoted by S2. In FIG. 7, the statuses S011 and S100 are denoted by S3 and S1, respectively.

As described above, FIG. 7 is a status transition diagram of four-value four-status Viterbi decoding method. FIG. 7 shows four statuses S0 to S4 and four reproduced signal values c[k+1]=−A−B, −A, A, and A+B. There are two status transitions starting from each of the statuses S0 and S2. There is only one status transition starting from each of the statuses S1 and S3.

Figure 8:
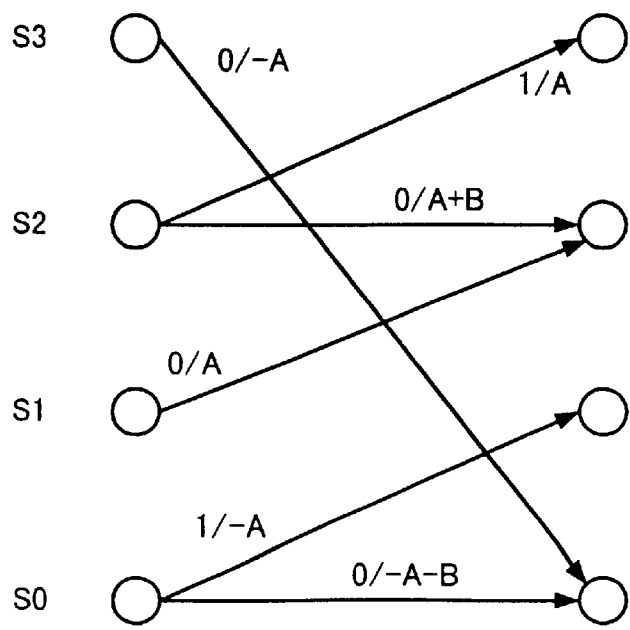
FIG. 8 is a schematic diagram showing an example of a Trellis diagram in the four-value four-status Viterbi decoding method.

As a format for chronologically representing status transitions, a trellis diagram as shown in FIG. 8 is used. In FIG. 8, status transitions between two time points are shown. However, it should be noted that transitions among many time points can be represented. In a trellis diagram, as time elapses, statuses changes rightwardly. Thus, a horizontal arrow represents a status transition of the same status (for example, from S0 to S0). On the other hand, a diagonal arrow represents a status transition of different statuses (for example, from S1 to S2).

Next, step (3) of the Viterbi decoding method (namely, based on the status transition diagram shown in FIG. 7, a method for selecting the maximum likelihood status transition from a really reproduced signal z[k] that includes noise) will be described.

To select the maximum likelihood status transition, with respect to a status at a particular time point k, the sums of likelihood of status transitions at a plurality of time points through other statuses are calculated. The sums are compared and the maximum likelihood decoded data sequence is selected. A sum of likelihood of status transitions is referred to as path metric.

To calculate a path metric, it is necessary to calculate the likelihood of a status transition between two adjacent time points. This calculation is performed with the value of the reproduced signal z[k] corresponding to the above-described status transition diagram in the following manner. Now, consider a status Sa at a time point k−1. When a reproduced signal z[k] is input to the Viterbi decoder 31, the likelihood of a status transition to the status Sb is calculated as follows. In this case, statuses Sa and Sb are selected from four statuses in the status transition diagram shown in FIG. 7.

$$(z[k]-c(Sa, Sb))^2 \quad (12)$$

In Formula (12), c(Sa, Sb) is the value of a reproduced signal in a status transition from the status Sa to the status Sb in the status transition diagram shown in FIG. 7. In other words, in FIG. 7, in the status transition S0→S1, c(Sa, Sb) is −A. Thus, Formula (12) represents an Euclidean distance between the value of the really reproduced signal z[k] that includes noise and the value of the reproduced signal c(Sa, Sb) calculated without considering noise. A path metric at a particular time point is defined as the sum of likelihood of status transitions between adjacent time points.

Now, consider a status Sa at a time point k. In this case, when the status that changes to a status Sa at a time point k−1 is Sp, a path metric L(Sa, k) is calculated with a path metric at a time point k−1 as follows.

$$L(Sa, k)=L(Sp, k-1)+(z[k]-c(Sp, Sa))^2 \quad (13)$$

In other words, by adding a path metric L(Sp, k−1) in the status Sp at the time point k−1 and the likelihood (z[k]−c(Sp, Sa))² of the status transition Sp→Sa between the time point k−1 and the time point k, a path metric L(Sa, k) is calculated. The likelihood of the latest status transition as in (z[k]−c(Sp, Sa)) is referred to as branch metric. It should be noted that the branch metric is different from a branch metric calculated by a branch metric calculating circuit (BMC) 20 of the Viterbi decoder 13 (namely, a branch metric corresponding to a standardized metric).

When the status at a time point k is Sa, there may be a plurality of statuses that change to the status Sa at a time point k−1 (as in the status S0 and S2 shown in FIG. 7). When the status at the time point k is S0, the statuses that change to the status S0 at the time point k−1 are two statuses S0 and S3. When the status at the time point k is S2, there are two statuses S1 and S2 that change to the status S2 at the time point k−1. For general description, when the status at the time point k is Sa and the statuses that change to the status Sa at the time point k−1 are two statuses Sp and Sq, the path metric L(Sa, k) is calculated as follows.

$$L(Sa, k)=\min \{L(Sp, k-1)+(z[k]-c(Sp, Sa)^2, L(Sq, k-1)+(z[k]-c(Sq, Sa))^2\} \quad (14)$$

In other words, with respect to each of the case that the status at the time point k−1 is Sp and the status Sp changes to the status Sa by a status transition Sp→Sa and the case that the status at the time point k−1 is Sq and the status Sq changes to the status Sa by a status transition Sq→Sa, the sum of likelihood is calculated. The sums are compared. The smaller value of the sums is defined as a path metric L(Sa, k) for the status Sa at the time point k.

When the calculation for such a path metric is applied to the above-described four values and four statuses shown in FIG. 7, path metrics L(0, k), L(1, k), L(2, k), and L(3, k) of the statuses S0, S1, S2, and S3 at the time point k can be calculated with path metrics L(0, k−1), L(1, k−1), L(2, k−1), and L(3, k−1) in the statuses S0, S1, S2, and S3 at the time point k−1, respectively, as follows.

$$L(0, k)=\min \{L(0, k-1)+(z[k]+A+B)^2, L(3, k-1)+(z[k]+A)^2\} \quad (15)$$

$$L(1, k)=L(0, k-1)+(z[k]+A)^2 \quad (16)$$

$$L(2, k)=\min \{L(2, k-1)+(z[k]-A-B)^2, L(1, k-1)+(z[k]-A)^2\} \quad (17)$$

$$L(3, k)=L(2, k-1)+(z[k]-A)^2 \quad (18)$$

As described above, by comparing the values of the calculated path metrics, the maximum likelihood status transition is selected. To select the maximum likelihood status transition, it is not necessary to calculate the values of the path metrics. Instead, the values of the path metrics are compared. Thus, in the real four-value four-status Viterbi decoding method, when standardized path metrics that are defined as follows are used instead of path metrics, calculations with respect to z[k] at each time point k can be easily performed.

$$m(i, k)=[L(i, k)-z[k]^2-(A+B)^2]/2/(A+B) \quad (19)$$

When Formula (19) is applied to each of the statuses S0 to S3, standardized path metrics do not include square terms. Thus, the calculations of an adding, comparing, and selecting circuit (ACS) 21 can be simplified.

$$m(0, k)=\min\{m(0, k-1)+z[k], m(3, k-1)+\alpha\times z[k]-\beta\} \quad (20)$$

$$m(1, k)=m(0, k-1)+\alpha\times z[k]-\beta \quad (21)$$

$$m(2, k)=\min \{m(2, k-1)-z[k], m(1, k-1)-\alpha\times z[k]-\beta\} \quad (22)$$

$$m(3, k)=m(2, k-1)+\alpha\times z[k]-\beta \quad (23)$$

where α and β of Formulas (20) to (23) are defined as follows.

$$\alpha=A/(A+B) \quad (24)$$

$$\beta=B\times(B+2\times A)/2/(A+B) \quad (25)$$

FIG. 9 shows conditions of status transitions of the four-value four-status Viterbi decoding method corresponding to such standardized path metrics. There are two formulas for selecting one from two in the above-described four standardized path metrics. Thus, there are (2×2=4) conditions.

Outline of Four-value Four-status Viterbi Decoder

Next, the Viterbi decoder 13 that accomplishes the above-described four-value four-status Viterbi decoding method will be described. The Viterbi decoder 13 comprises a branch metric calculating circuit (BMC) 20, an adding, comparing, and selecting circuit (ACS) 21, a compression and latch circuit 22, and a path memory unit (PMU) 23. The above-described read clock pulses DCK (simply referred to as clock pulses) are supplied to individual structural portions of the decoder 13 so as to match the operation timings of the structural portions of the entire Viterbi decoder 13. Next, the structural portions of the Viterbi decoder 13 will be described one after the other.

The BMC 20 calculates values BM0, BM1, BM2, and BM3 of branch metrics corresponding to standardized path metrics based on an input reproduced signal z[k]. The values BM0 to BM3 are required to calculate the standardized path metrics in Formulas (20) to (23). The values BM0 to BM3 are expressed as follows.

$$BM0=z(k) \quad (26)$$

$$BM1=\alpha\times z[k]-\beta \quad (27)$$

$$BM2=-z(k) \quad (28)$$

$$BM3=-\alpha\times z[k]-\beta \quad (29)$$

where α and β are reference values calculated corresponding to Formulas (24) and (25) by the BMC 20. In these calculations, an envelop is detected corresponding to for example a reproduced signal [k]. α and β are calculated corresponding to identification points −A−B, −A, A, and A+B that is detected by an envelop detecting method corresponding to the reproduced signal z[k] and that is supplied to the BMC 20.

The values BM0 to BM3 are supplied to the ACS 21. On the other hand, the ACS 21 receives values M0, M1, M2, and M3 (that have been compressed) of standardized path metrics one clock pulse prior from the compression and latch circuit 22. By adding the values M0 to M3 and BM0 to BM3, the values L0, L1, L2, and L3 of the latest standardized path metrics are calculated. Since the values M0 to M3 have been compressed, L0 to L3 can be prevented from overflowing.

The ACS 21 selects the maximum likelihood status transition (that will be described later) corresponding to the values L0 to L3 of the latest standardized path metrics. Corresponding to the selected result, the signal levels of the selection signals SEL0 and SEL2 supplied to the path memory 23 become "High" or "Low".

The ACS 21 supplies the values L0 to L3 to the compression and latch circuit 22. The compression and latch circuit 22 compresses the values L0 to L3 and then latches them. Thereafter, the ACS 21 supplies the compressed values L0 to L3 as standardized path metrics M0 to M3 one clock pulse prior to the ACS 21.

As an example of the compressing method, one (for example, L0) of the latest standardized path metrics L0 to L3 is subtracted therefrom in the following manner.

$$M0=L0-L0 \quad (30)$$

$$M1=L1-L0 \quad (31)$$

$$M2=L2-L0 \quad (32)$$

$$M3=L3-L0 \quad (33)$$

As a result, M0 is always 0. However, in the following description, to keep the generality, M0 is represented as it is. The differences of the values M0 to M3 calculated by Formulas (30) to (33) are equal to the differences of the values L0 to L3. As described above, in the selection of the maximum likelihood status transition, only the differences of the values of the standardized path metrics are important. Thus, such a compressing method is effective for a method for compressing the values of the standardized path metrics without affecting the selected result of the maximum likelihood status transition and for preventing L0 to L3 from overflowing. In such a manner, the ACS 21 and the compression and latch circuit 22 compose a loop with respect to calculations of standardized path metrics.

Figure 11:
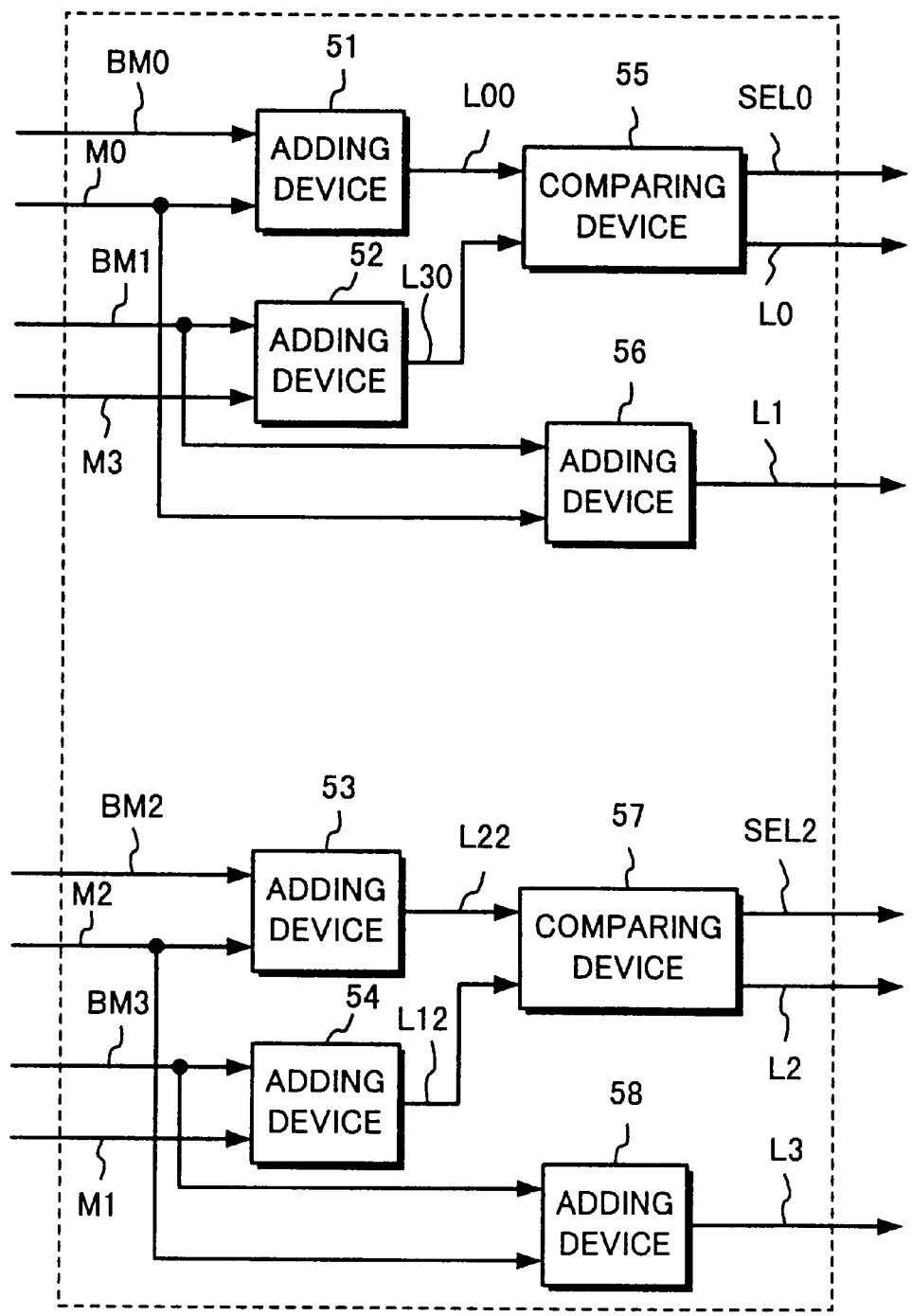
FIG. 11 is a block diagram showing the structure of a part of the Viterbi decoder shown in FIG. 10.

Next, with reference to FIG. 11, the ACS 21 will be described in detail. The ACS 21 is composed of six adding devices 51, 52, 53, 54, 56, and 58 and two comparing devices 55 and 57. On the other hand, values M0 to M3 of compressed standardized path metrics one clock pulse prior and values BM0 to BM3 of branch metrics corresponding thereto are supplied to the ACS 21.

The values M0 and BM0 are supplied to the adding device 51. The adding device 51 adds the values M0 and BM0 and outputs L00 that is expressed as follows.

$$L00 = M0 + BM0 \qquad (34)$$

As described above, th value M0 is a compressed standardized path metric corresponding to the sum of status transitions in the status S0 at the time point k−1. The value BM0 is calculated with the reproduced signal z[k] at the time point k corresponding to Formula (26). The value BM0 is the value z[k]. Consequently, the value of Formula (34) is a calculated value of m(0, k−1)+z[k] (that has been compressed) in Formula (20). In other words, the value of Formula (34) is a calculated value in the case that the status S0 at the time point k−1 changes to the status S0 at the time point k by a status transition S0

On the other hand, the values M3 and BM1 are supplied to the adding device 52. The adding device 52 adds the values M3 and BM1 and outputs L30 that is expressed as follows.

$$L30 = M3 + BM1 \qquad (35)$$

As described above, the value M3 is a compressed standardized path metric corresponding to the sum of status transitions in the case that the status at the time point k−1 is S3. The value BM1 is calculated with the reproduced signal z[k] at the time point k corresponding to Formula (27). Thus, The value BM1 is expressed by $\alpha \times z[k] - \beta$. Consequently, the value of Formula (35) is a calculated value of m(3, k−1)+$\alpha \times z[k] - \beta$ (that has been compressed) in Formula (20). In other words, the value of Formula (35) is a calculated value in the case that the status S3 at the time point k−1 changes to the status S0 at the time point k by a status transition S3→S0.

The values L00 and L30 are supplied to the comparing device 55. The comparing device 55 compares the values L00 and L30 and treats the smaller value as the latest standardized path metric L0. In addition, corresponding to the selected result, as described above, the comparing device 55 changes the signal level of the selection signal SEL0. This structure corresponds to the selection of the minimum value in Formula (20). In other words, when L00<L30 (in this case, the status transition S0→S0 is selected), the comparing device 55 outputs the value L00 as the values L0 and causes the signal level of the selection signal SEL0 to be for example "Low". On the other hand, when L30<L00 (in this case, the status transition S3→S0 is selected), the comparing device 55 outputs the value L30 as the value L0 and causes the signal level of the selection signal SEL0 to be for example "High". As will be described later, the selection signal SEL0 is supplied to an A type path memory 24 (that will be described later) corresponding to the status S0.

As described above, the adding devices 51 and 52 and the comparing device 55 select the maximum likelihood status transition at the time point k from the status transitions S0→S0 and S3→S0 corresponding to Formula (20). Corresponding to the selected result, the comparing device 55 outputs the latest standardized path metric L0 and the selection signal SEL0.

The values M0 and BM1 are supplied to the adding device 56. The adding device 51 adds the values M0 and BM1 and outputs L1 expressed as follows.

$$L1 = M0 + BM1 \qquad (36)$$

As described above, the value M0 is a compressed standardized path metric corresponding to the sum of the status transitions in the case that the status at the time point k−1 is S0. The value BM1 is calculated with the reproduced signal z[k] at the time point k corresponding to Formula (27). Namely, the value BM1 is expressed by $\alpha \times z[k] - \beta$. Thus, the value of Formula (36) is a calculated value of the right side m(0, k−1)+$\alpha \times z[k] - \beta$ (that has been compressed) in Formula (21). In other words, the value of Formula (36) is a calculated value in the case that the status S0 at the time point k−1 changes to the status S1 at the time point k by a status transition S0→S1. In Formula (21), a value is not selected. Thus, the output data of the adding device 56 is the latest standardized path metric L1.

The values M2 and BM2 are supplied to the adding device 53. The adding device 53 adds the values M2 and BM2 and outputs L22 expressed as follows.

$$L22 = M2 + BM2 \qquad (37)$$

As described above, the value M2 is a compressed standardized path metric corresponding to the sum of status transitions in the case that the status at the time point k−1 is S2. The value BM0 is calculated with the reproduced signal z[k] at the time point k corresponding to Formula (28). In other words, the value BM0 is −z[k]. Thus, the value of Formula (37) is a calculated value of m(2, k−1)−z[k] (that has been compressed) in Formula (22). In other words, the value of Formula (37) is a calculated value in the case that the status S2 at the time point k changes to the status S2 by a status transition S2→S2.

On the other hand, the values M1 and BM3 are supplied to the adding device 54. The adding device 53 adds the values M1 and BM3 and outputs L12 expressed as follows.

$$L12 = M1 + BM3 \qquad (38)$$

As described above, the value M1 is a compressed standardized path metric corresponding to the sum of status transitions in the case that the status at the time point k−1 is S1. The value BM3 is calculated with the reproduced signal z[k] at the time point k corresponding to Formula (29). In other words, the value BM3 is expressed by $-\alpha \times z[k] - \beta$. Thus, the value of Formula (38) is a calculated value of m(1, k−1)−$\alpha \times z[k] - \beta$ (that has been compressed) in Formula (22). In other words, the value of Formula (38) is a calculated value in the case that the status S1 at the time point k−1 changes to the status S2 at the time point k by a status transition S1→S2.

The values L22 and L12 are supplied to the comparing device 57. The comparing device 57 compares the values L2 and L12, treats the smaller value as the latest standardized path metric L2, and changes the signal level of the selection signal SEL2 corresponding to the selected result. This structure corresponds to the selection of the minimum value in Equation (22). In other words, when L22<L12 (in this case, the status transition S2→S2 is selected), the comparing device 57 outputs the value L22 as L2 and causes the signal level of the selection signal SEL2 to be for example "Low". On the other hand, when L12<L22 (in this case, the status transition S1→S2 is selected), the comparing device 57 outputs the value L12 as L2 and causes the signal level of the selection signal SEL2 to be for example "High". As will be descried later, the selection signal SEL2 is supplied to an A type path memory 26 that corresponds to the status S2.

The adding devices 53 and 54 and the comparing device 57 select the maximum likelihood status transition at the time period k from the status transitions S1→S2 and S2→S2 corresponding to Formula (22). The comparing device 57 outputs the latest standardized path metric L2 and the selection signal SEL2 corresponding to the selected result.

The values M2 and BM3 are supplied to the adding device 58. The adding device 58 adds the values M2 and BM3 and outputs L3 expressed as follows.

$$L3 = M2 + BM3 \quad (39)$$

As described above, the value M2 is a compressed standardized path metric corresponding to the sum of status transitions in the case that the status at the time point k−1 is S2. The value BM3 is calculated with the reproduced signal z[k] at the time point k corresponding to Formula (29). In other words, the value BM3 is expressed by −α×z[k]−β. Thus, the value of Formula (23) is a calculated value of the right side m(2, k−1)+α×z[k]−β (that has been compressed) in Formula (23). In other words, the value of Formula (23) is a calculated value in the case that the status S0 at the time point k−1 changes to the status S3 at the time point k by a status transition S2→S3. In Formula (23), a value is not selected. Thus, the output data of the adding device 58 is the latest standardized path metric L3.

As described above, since the path memory unit (PMU) 23 operates corresponding to the selection signals SEL0 and SEL2 received from the ACS 21, decoded data a'[k] as the maximum likelihood decoded data sequence according to the recorded data a[k] is generated. The PMU 23 is composed of two A type bus memories and two B type bus memories that correspond to status transitions of four statuses shown in FIG. 7.

An A type path memory has two transitions to a particular status (namely, a transition from the particular status to the same status and a transition from another status to the particular transition). In addition, the A type path memory has a structure corresponding to two transitions starting from the particular status (namely, a transition from the particular status to the same status and a transition from the particular status to another status). Thus, the A type path memory corresponds to the two statuses S0 and S2 of the four statuses shown in FIG. 7.

On the other hand, a B type path memory has one transition to a particular status. In addition, the B type path memory has a structure corresponding to one transition starting from the particular status. Thus, the B type path memory corresponds to the status S1 or S3 of the four statuses shown in FIG. 7.

Figure 10:
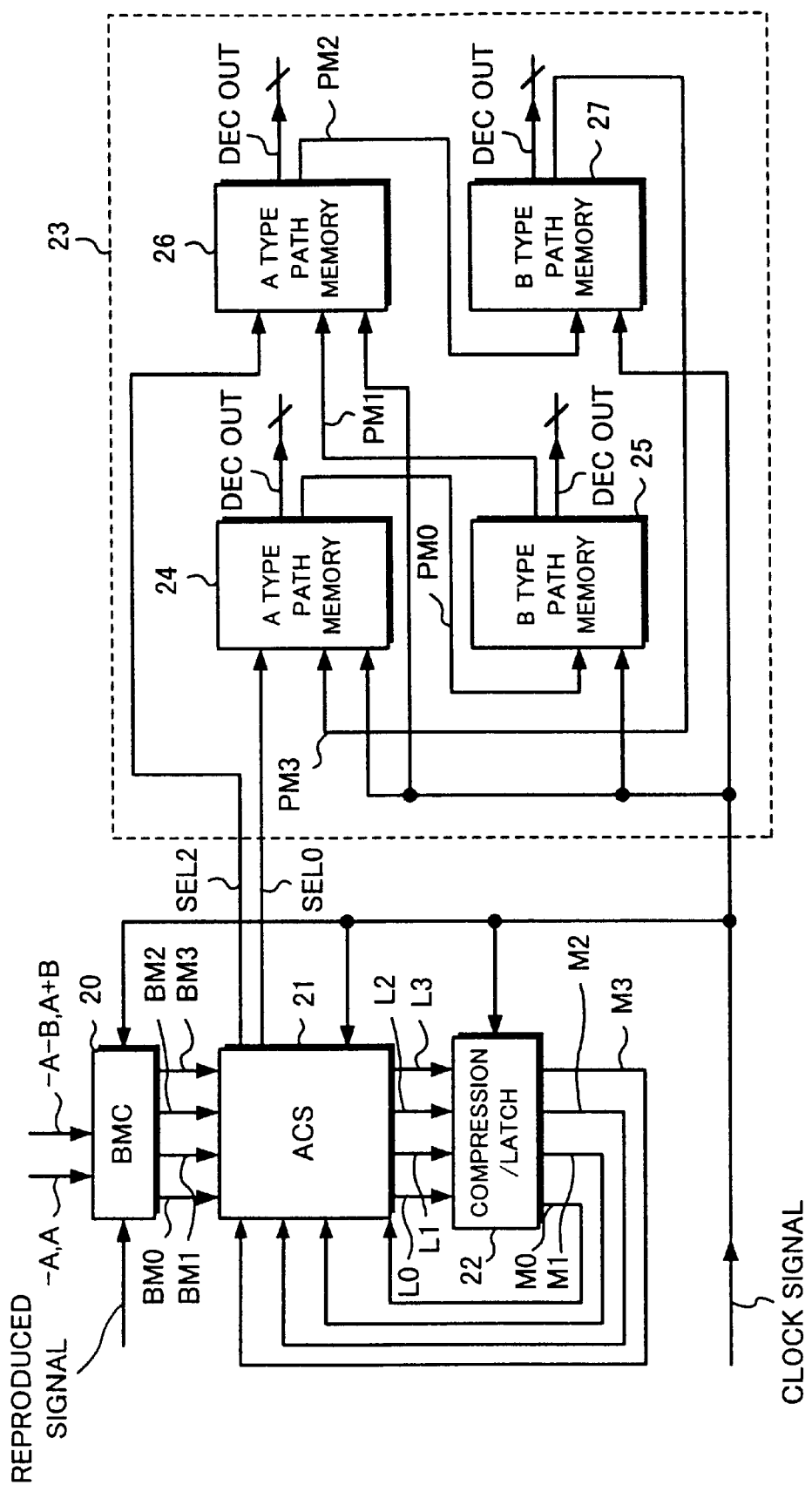
FIG. 10 is a block diagram showing the overall structure of a Viterbi decoder that performs the four-value four-status Viterbi decoding process.

The PMU 23 exchanges decoded data as shown in FIG. 10 so that the two A type path memories and the two B type path memories operate corresponding to the status transition diagram shown in FIG. 7. In other words, the A type path memories 24 and 26 correspond to the statuses S0 and S2, respectively. The B type path memories 25 and 27 correspond to the statuses SI and S3, respectively. Thus, the status transitions starting from S0 are S0→S0 and S0→S1. The status transitions starting from S2 are S2→S2 and S2→S3. In addition, the status transition starting from S1 is only S1→S2. The status transition starting from S3 is S3→S0.

Figure 12:
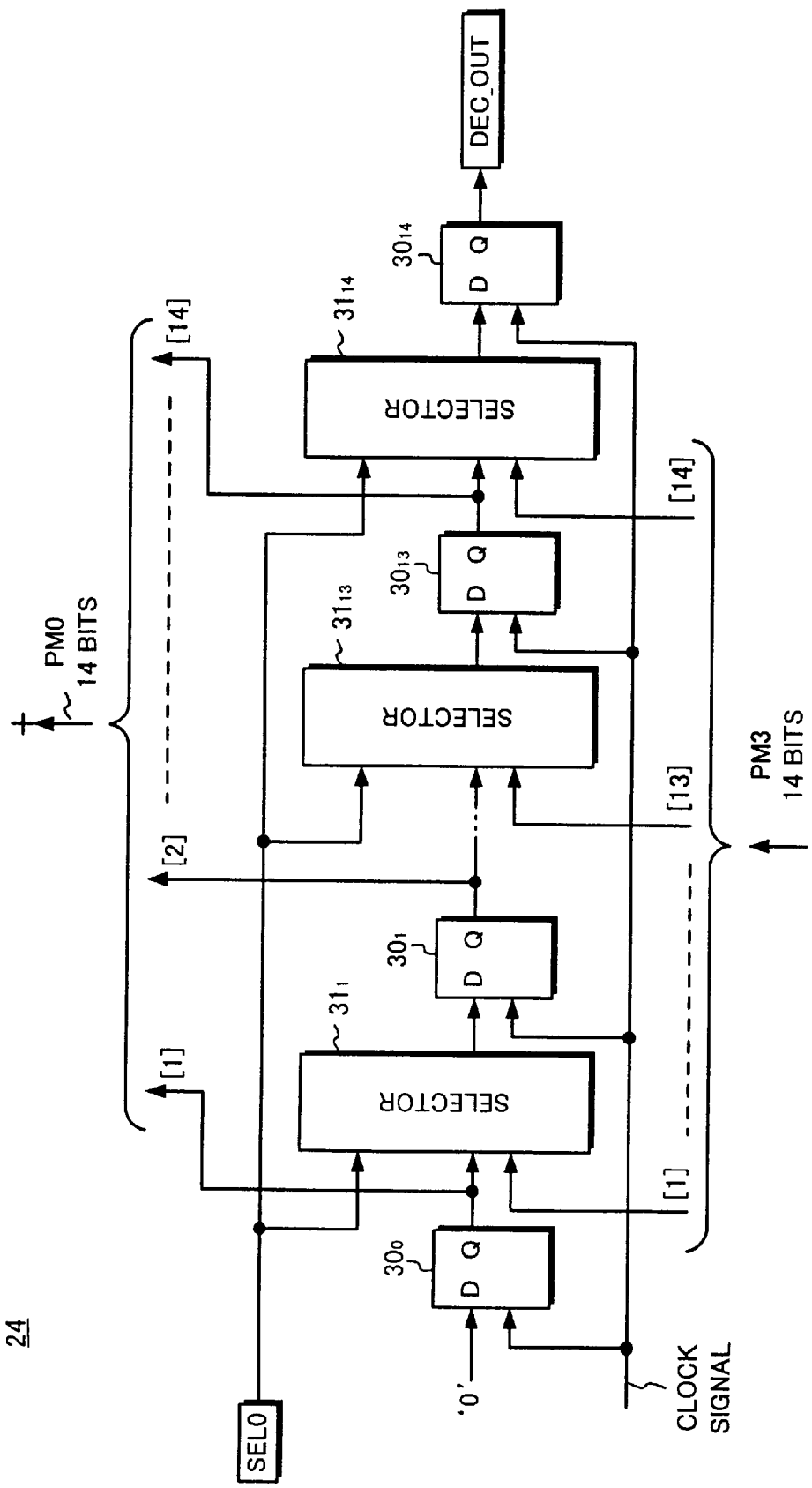
FIG. 12 is a block diagram showing the structure of another part of the Viterbi decoder shown in FIG. 10.

FIG. 12 shows the detailed structure of the A type path memory 24. The A type path memory 24 is composed of flip-flops and selectors that are alternately disposed corresponding to the length of the path memory. The structure shown in FIG. 12 has a decoded data length of 14 bits. In other words, the A bus memory 24 has 14 selectors $31_1$ to $31_{14}$ and 15 flip-flops $30_0$ to $30_{14}$. The selectors $31_1$ to $31_{14}$ each receive two data values and selectively supplies one of them to the next stage. In addition, clock pulses are supplied to the flip-flops $30_0$ to $30_{14}$ so as to match the operation timings of the structural portions of the A type path memory 24.

As was described in FIG. 7, transitions to the status S0 are S0→S0 (where the self status is taken over) and S3→S0. In the structure that corresponds to such a situation, each selector receives data from the flip-flop on the preceding stage (namely, decoded data corresponding to the status transition S0→S0) and data received from the B type path memory 27 that corresponds to the status S3 (namely, decoded data PM3 corresponding to the status transition S3→S0). In addition, each selector receives the selection signal SEL0 from the ACS 21. Each selector supplies one of two decoded data values to the flip-flop on the next stage corresponding to the signal level of the selection signal SEL0. The decoded data value that is supplied to the flip-flop on the next stage is also supplied as PM0 to the B type path memory 25 that corresponds to the status S1.

In other words, the selector $31_{14}$ receives a data value from the flip-flop $30_{13}$ on the preceding stage and the 14-th bit of the decoded data value PM3 from the B type path memory 27. The selected data value is supplied to the flip-flop $30_{14}$ on the next stage. As described above, corresponding to the selected result, the signal level of the selection signal SEL0 is set to "Low" or "High". When the signal level of the selection signal SEL0 is for example "Low", a data value received from the flip-flop $30_{13}$ on the preceding stage is selected. When the signal level of the selection signal SEL0 is for example "High", the 14-th bit of the decoded data value PM3 is selected. The selected data value is supplied to the flip-flop $30_{14}$ on the next stage. The 14-th bit of the decoded data value PM0 is supplied to the B type path memory 25 that corresponds to the status S1.

The other selectors $31_1$ to $31_{13}$ of the A type path memory 24 operate as with the selector $31_{14}$ corresponding to the signal level of the signal level SEL0. Thus, when the selection signal SEL0 is for example "Low", the A type path memory 24 perform a serial shifting operation of which each flip-flop takes over data of the flip-flop on the preceding stage. On the other hand, when the signal level of the selection signal SEL0 is "High", the A type path memory performs a parallel loading operation of which each flip-flop takes over the decoded data value PM3 of 14 bits received from the B type path memory 27. In any case, the decoded data value that is taken over is supplied as the decoded data value PM0 of 14 bits to the B type path memory 25. "0" is always supplied to the flip-flop $30_0$ on the first stage in synchronization with the clock signal. In each of the status transitions S0→S0 and S2→S0, as shown in FIG. 7, since the decoded data value is "0", the latest decoded data value is always "0".

As described above, the structure of the A type path memory 26 that corresponds to S2 is the same as the structure of the A type path memory 24. However, the A type path memory 26 receives the selection signal from the ACS 21. In addition, as shown in FIG. 7, there are two transitions S2→S2 (where the self status is taken over) and S1→S2. Thus, the B type path memory 25 that corresponds to the status S1 supplies the decoded value PM1 to the A type path memory 26. In addition, since the status transitions starting from S2 are S2 and S3, the A type path memory 26 supplies the decoded data value PM2 to the B type pass memory 27 that corresponds to the status S3.

"0" is always supplied to the flip-flop on the first stage of the A type path memory 26 that corresponds to the status S2 in synchronization with the clock signal. This operation in each of the status transitions S2→S2 and S1→S2 corresponds to the situation that since the decoded data value is "0", the latest decoded data value is always "0".

Figure 13:
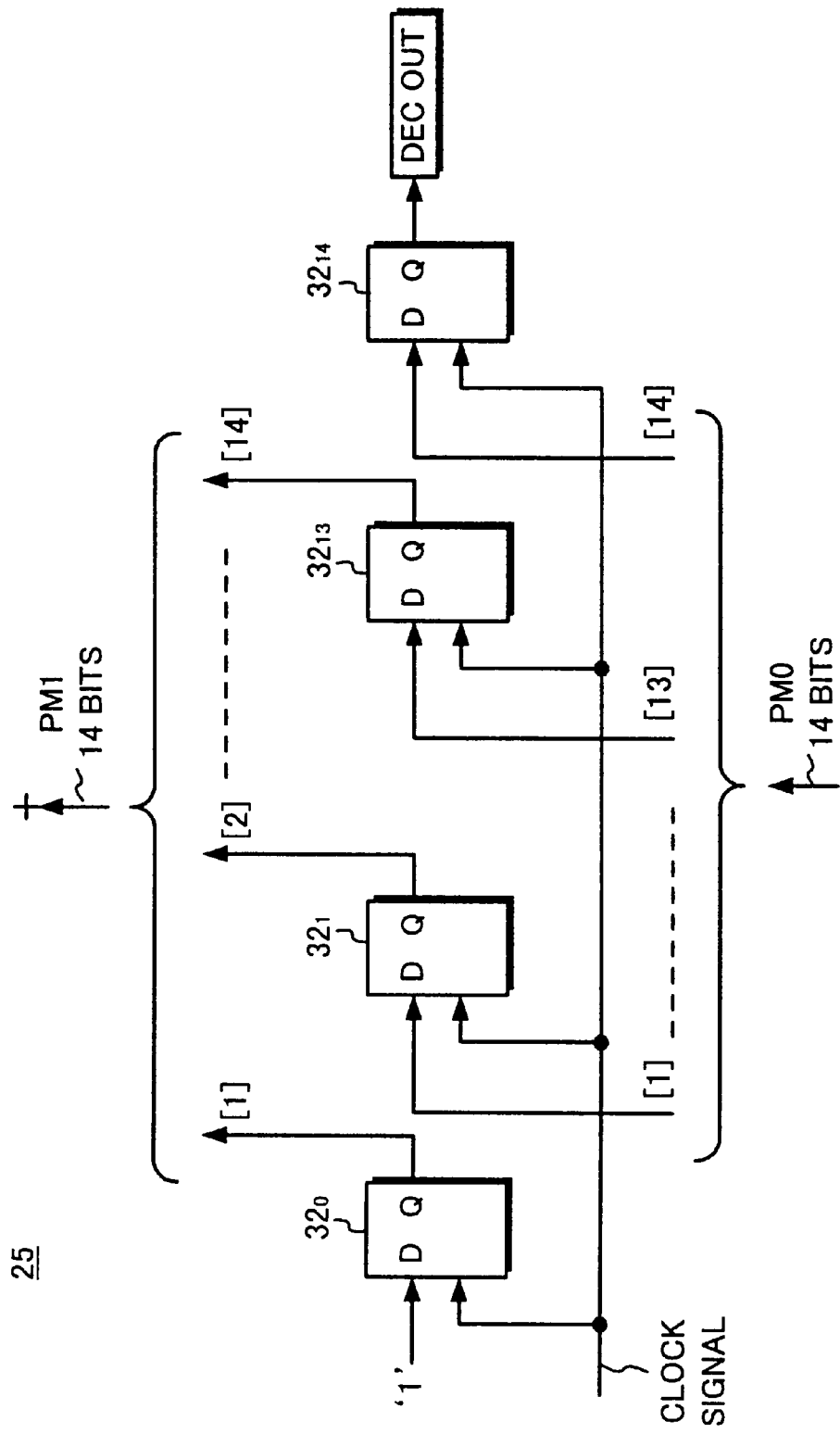
FIG. 13 is a block diagram showing the structure of a further other part of the Viterbi decoder shown in FIG. 10.

FIG. 13 shows the detailed structure of the B type path memory 25. The B type path memory 25 is composed of flip-flops corresponding to the length of the path memory.

FIG. 13 shows a structure corresponding to a decoded data length of 14 bits. In other words, the B type path memory 25 has 15 flip-flops $32_0$ to $32_{14}$. Clock pulses are supplied to the flip-flops $32_0$ to $32_{14}$ so as to match the operation timings of the structural portions of the B type path memory 25.

The A type path memory 24 that correspond to the status S0 supplies a decoded data value of 14 bits as PM0 to the flip-flops $32_1$ to $32_{14}$. For example, the first bit of the decoded data value PM0 is supplied to the flip-flop $32_1$. Each of the flip-flops $31_1$ to $32_{14}$ stores the received value for the period of one clock pulse and supplies the stored value as a decoded data value PM1 of 14 bits to the A type path memory 26 that corresponds to the status S2. For example, the flip-flop $32_1$ outputs the second bit of the decoded data value PM1.

The other flip-flops $32_0$ to $32_{13}$ of the B type path memory 25 operate as with the flip-flop $32_1$. Thus, the B type path memory 25 receives the decoded data value PM0 of 14 bits from the A type path memory 24 and supplies the decoded data value PM1 of 14 bits to the A type path memory 26.

"1" is always supplied to the flip-flop $32_0$ in synchronization with the clock signal. This operation corresponds to the situation that when the latest status transition is S0→S1, the decoded data value is "1".

As described above, the structure of the B type path memory 27 that corresponds to the status S3 is the same as the structure of the B type path memory 25. However, as shown in FIG. 7, since the status transition to the status S3 is S2→S3, the decoded data value PM2 is supplied from the A type path memory 26 that corresponds to the status S2 to the B type path memory 27. In addition, since the status starting from the status S3 is S0, the decoded data value PM3 is supplied to the A type path memory 24 that corresponds to the status S0. In the B type path memory 27, "1" is always supplied to the flip-flop on the last stage in synchronization with the clock signal. This operation corresponds to the situation that when the latest status transition is S2→S3, the decoded data is "1" as shown in FIG. 7.

As described above, the four path memories of the PMU 23 respectively generate decoded data values. The four decoded data values are always the same when the Viterbi decoding process is accurately performed. In the real Viterbi decoding process, mismatches takes place in the four decoded data values. This situation takes place due to noise in a reproduced signal. Thus, when the identification points A and B are detected, an error takes place and thereby the Viterbi decoding process becomes inaccurate.

Generally, the probability of which the four decoded data values do not match can be lowered when the number of stages of path memories is increased. In other words, when the quality such as C/N of the reproduced signal is high, even if the number of stages of path memories is relatively small, the probability of which the four decoded data values do not match is low. On the other hand, when the quality of a reproduced signal is not high, to lower the probability of which the four decoded data values do not match, it is necessary to increase the number of stages of path memories. When the number of stages of path memories is relatively small and thereby the probability of which the four decoded data values do not match cannot be sufficiently lowered, a structure (not shown) for selecting a proper decoded data value corresponding to the rule of majority is disposed downstream of the four path memories of the PMU 23.

Viterbi Decoding Method Other than Four-value Four-status Viterbi Decoding Method The above-described four-value four-status Viterbi decoding method is applied to the case that the waveform equalizing characteristic of the filter portion 11 is PR(1, 2, 1) and that RLL(1, 7) code is used for recorded data. In the conditions that the record linear density is 0.40 $\mu$m, that the laser wavelength is 685 nm, and that NA is 0.55, with a waveform equalizing characteristic PR(1, 2, 1), the four-value four-status Viterbi decoding method can be optimally used. However, another Viterbi decoding method may be used corresponding to the waveform equalizing characteristic or an encoding method for generating recorded data.

For example, in the case that the waveform equalizing characteristic is PR(1, 1) and that an RLL(1, 7) code is used for recorded data, three-value four-status Viterbi decoding method is used. On the other hand, in the case that the waveform equalizing characteristic is PR(1, 3, 3, 1) and that an RLL(1, 7) code is used for recorded data, seven-value six-status Viterbi decoding method is used. A proper Viterbi decoding methods is selected from such methods corresponding to a waveform equalizing characteristic that is properly adapted to an inter-code interference of a reproduced signal. Thus, an optimum Viterbi decoding method is selected corresponding to a record linear density and MTF.

The Viterbi decoder 13 as an example of the above-described magneto-optic disc apparatus generates decoded data as a decoded data sequence corresponding to the maximum likelihood status transition selected corresponding to reproduced signal values. On the other hand, status data values that represent statuses instead of decoded data values may be used so as to generate status data values that represent selected status transitions. In this case, instead of the path metric unit PMU as an example of the above-described magneto-optic disc unit, a status memory unit (SMU) that generates a sequence of status data values (that will be described later) is used.

According to the present invention, with the SMU, status data values are generated. The individual status data values generated by the status memories of the SMU are compared. By detecting matches or mismatches of the status data values, it is determined whether or not the status data values are settled so as to count the number of mismatches. With the counted value, the reliability of the decoded data, the quality of the signal reproduced from a record medium, and the characteristics of the reproducing system can be evaluated.

Figure 14:
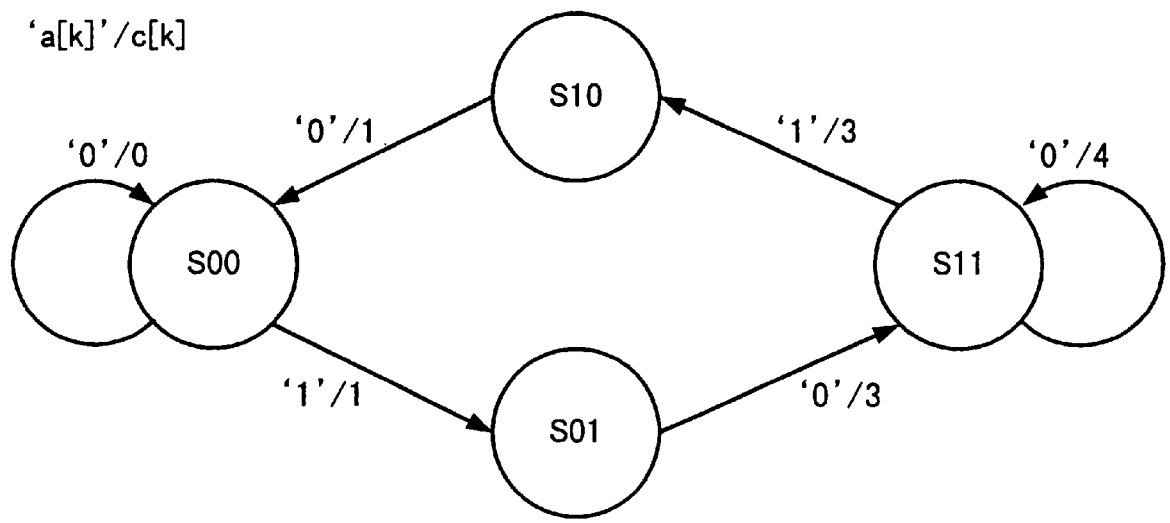
FIG. 14 is a schematic diagram showing an example of a status transition diagram in the four-value four-status Viterbi decoding method in a particular denoting method other than the denoting method shown in FIG. 7.

For example, when four statuses are used as in the four-value four-status Viterbi decoding method or the like, since the four statuses can be expressed with two bits, the two-bit data values can be used as status data values. Thus, the statuses S0, S1, S2, and S3 shown in FIG. 7 can be expressed with two-bit status data values 00, 01, 11, and 10. Consequently, in the following description, the statuses S0, S1, S2, and S3 shown in FIG. 7 are denoted by S00, S01, S1, and S10, respectively. In this case, a status transition diagram of the four-value four-status Viterbi decoding method shown in FIG. 14 is used instead of that shown in FIG. 7.

In the following description, as a waveform equalizing characteristic, PR(1, 2, 1) that has been standardized is used instead of the above-described PR(B, 2A, B). Thus, reproduced signal values c[k] obtained by calculations of which values of identification points (namely, noise) are not considered are represented by 0, 1, 3, and 4 instead of −A−B, −A, A, and A+B shown in FIG. 7, respectively.

In Formulas (20) to (24) for calculating standardized path metrics, six addition portions corresponding to the latest status transition (for example, z[k] corresponding to S0→S0 and $\alpha \times z[k] - \beta$ corresponding to S3→S0 in Formula (20)) can be represented corresponding to the status notation shown in FIG. 14 as follows. Although these addition portions are different from branch metrics defined in Formula (13), for simplicity, in the following description, these addition portions are represented as branch metrics.

Figure 15:
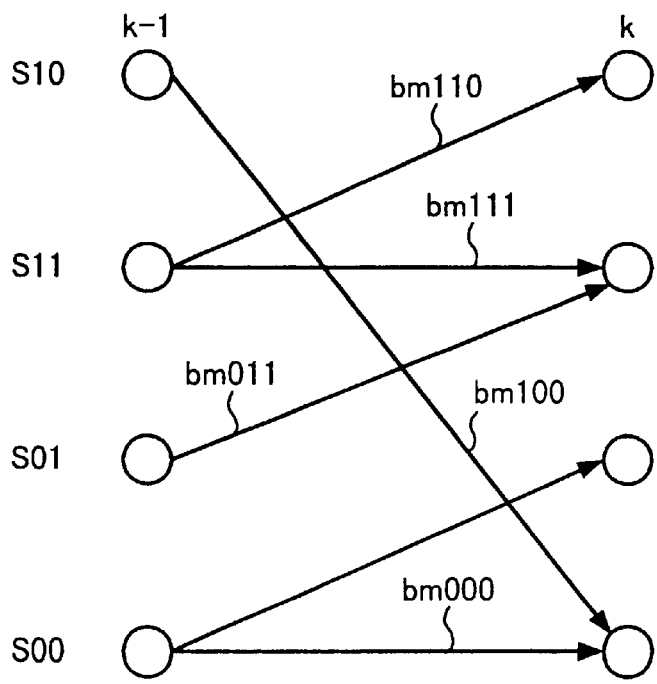
FIG. 15 is a schematic diagram for explaining a denoting method of branch metrics.

A status before a transition is represented by two bits. Likewise, a status after a transition is represented by two bits. By adding these two status values, a sequence of four bits is obtained. The second and third bits are represented by one bit. With the resultant three bits, a branch metric that takes place at one read clock period is represented. For example, a branch metric corresponding to a status transition S11→s10 is denoted by bm110. In such a manner, branch metrics corresponding to six status transitions shown in FIG. 14 can be represented as shown in FIG. 15.

Figure 16:
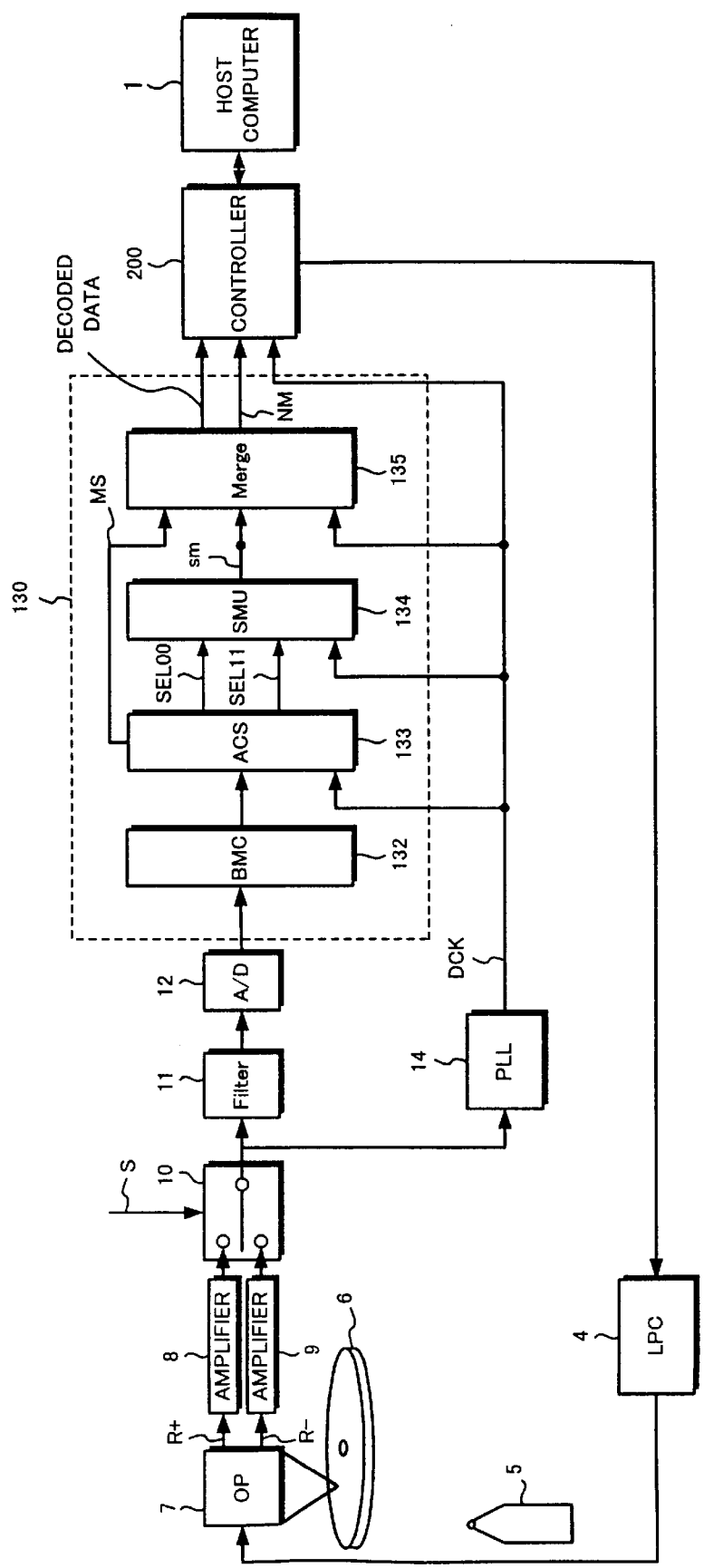
FIG. 16 is a block diagram showing the overall structure of an embodiment of the present invention.

FIG. 16 is a block diagram showing the overall structure of a magneto-optical disc apparatus according to an embodiment of the present invention. For simplicity, in FIG. 16, similar portions to those in FIG. 1 are denoted by similar reference numerals. The structures of a recording system and a servo system (not shown in FIG. 16) are the same as those shown in FIG. 1.

Next, the reproducing system of the magneto-optical disc apparatus will be described. The structure and operation of a circuit block ranging from an optical pickup 7 to an A/D converter 12 are the same as those in FIG. 1. In addition, the structure and operation of a PLL 14 (that generates read clock pulses) shown in FIG. 16 are the same as those shown in FIG. 1.

The Viterbi decoder 130 generates decoded data and a mismatch detection signal NM corresponding to the reproduced signal values z[k] received from the A/D converter 12 and supplies them to the controller 200. As with the above-described magneto-optical disc apparatus shown in FIG. 1, the controller 200 performs a decoding process with the received decoded data and reproduces user data, address data, and so forth. The controller 200 has a counting means that counts the number of mismatches of status data values corresponding to the mismatch detection signal NM.

The Viterbi decoder 130 is composed of a BMC 132, an ACS 133, an SMU 134, and a merge block 135. The read clock pulses DCK (hereinafter, simply referred to as clock pulses) are supplied from the PLL 14 to these structural portions so as to match the operation timings thereof.

The BMC 132 calculates the values of the branch metrics with the reproduced signal values z[k] and supplies the calculated values to the ACS 133.

Figure 17:
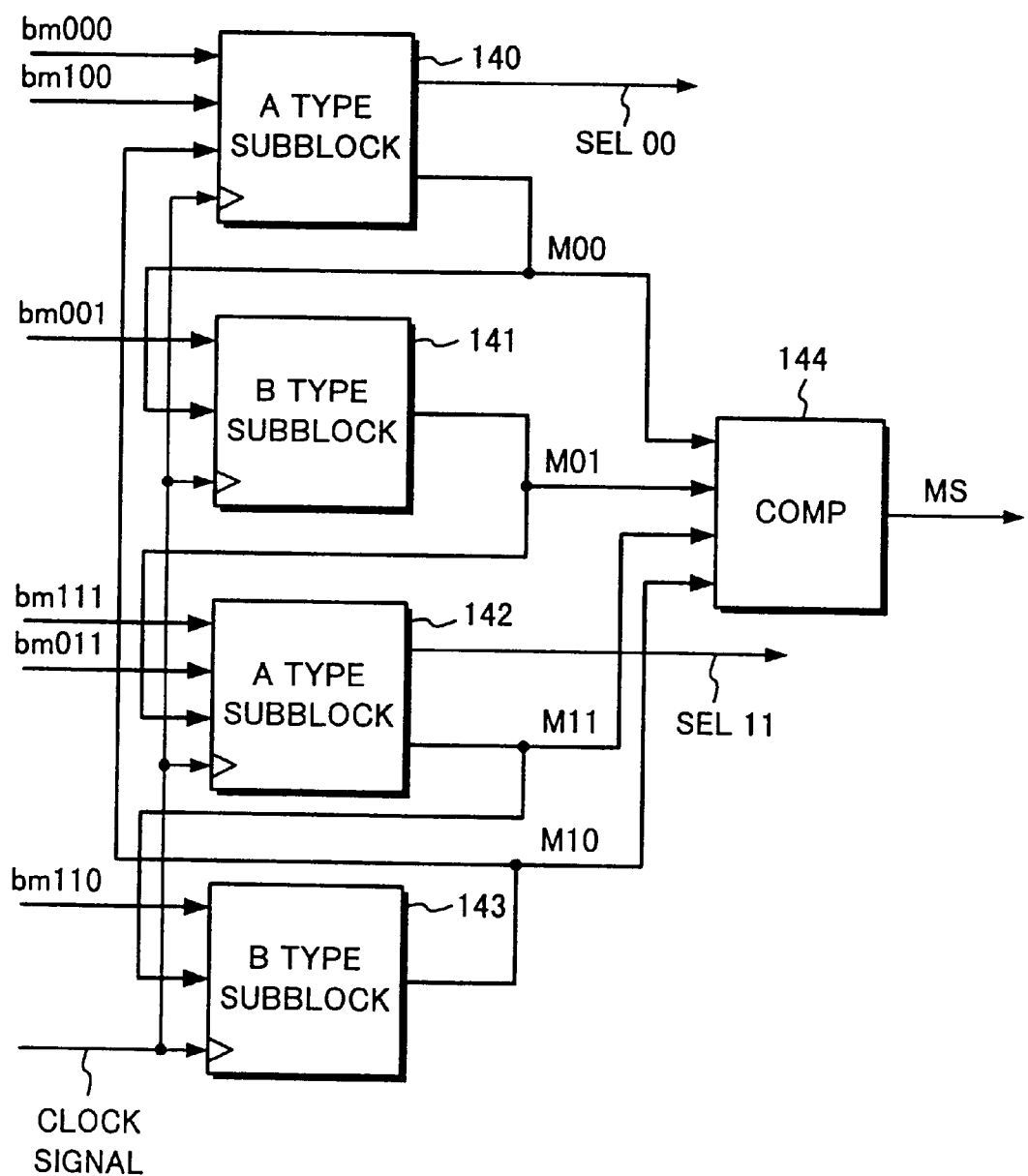
FIG. 17 is a block diagram showing an example of the structure of an ACS (Adding, Comparing, and Selecting) circuit according to an embodiment of the present invention.

Next, with reference to FIG. 17, the structure of the ACS 133 will be described. The ACS 133 has the structure of the ACS 21 and the structure of the compression and latch circuit 22 of the magneto-optic disc apparatus shown in FIG. 10. The ACS 133 has four sub blocks corresponding to four statuses. These sub blocks are connected so that values of standardized path metrics are exchanged corresponding to the status transition diagram shown in FIG. 14.

The statuses S00 and S11 that take over their self statuses correspond to A type sub blocks (that will be described later). In FIG. 16, A type sub blocks 140 and 142 correspond to the statuses S00 and S11, respectively. Statuses S01 and S10 that do not take over their self statuses correspond to B type sub blocks (that will be described later). In FIG. 16, B type sub blocks 141 and 143 correspond to the statuses S01 and S10, respectively.

The A type sub block 140 has the structure of a selection signal generating portion of the ACS 21 (see FIG. 11) of the above-described magneto-optic disc apparatus. In other words, the A type sub block 140 has two adding devices and one comparing device. The two adding devices are used to update the values of two path metrics. The A type sub block 140 has a means that stores values of updated path metrics. Thus, this means operates as with the compression and latch circuit 22.

A branch metric bm000 corresponding to a status transition S00→S00 and a branch metric bm100 corresponding to a status transition S10→S00 are supplied from the BMC 132 to the A type sub block 140 corresponding to clock pulses. The value of a standardized path metric that has been updated one clock period prior is supplied from the B type sub block 143 to the A type sub block 140. The A type sub block 140 adds the value of the path metric M10 that has been updated one clock period prior and the value of the branch metric bm000 so as to calculate the sum of the likelihood in the case that the latest status transition is S10→S00.

In addition, the A type sub block 140 adds the value of the standardized path metric M00 that has been latched therein and that has been updated one clock period prior and the value of the branch metric 000 so as to calculate the sum of the likelihood in the case that the latest transition is S00→S00.

The A type sub block 140 compares the two sums of the likelihood that have been calculated and selects the maximum likelihood status transition. The A type sub block 140 latches the sum of the likelihood corresponding to the selected status transition and outputs a selection signal M00 corresponding to the selected result. The value of the standardized path metric M00 that has been updated is latched by the A type sub block 140 and also sent to the B type sub block 141 corresponding to the status S01.

The structure of the A type sub block 142 corresponding to the status S11 is the same as the structure of the A type sub block 140. Branch metrics bm111 and bm011 corresponding to the status transitions S11→S11 and S01→S11 are supplied to the A type sub block 142. A standardized path metric M11 to be updated is latched by the A type sub block 142 and also supplied to the B type sub block corresponding to the status S10.

The B type sub block 141 has the structure of the ACS 21 (see FIG. 11) of the above-described magneto-optic disc apparatus except that a selection signal is not generated. In other words, the B type sub block 141 has one adding device that updates the value of one path metric. In addition, the B type sub block 141 has a means that stores the value of the path metric to be updated. This means has the same function as the compression and latch circuit 22.

A branch metric bm011 corresponding to a status transition S00→S01 is supplied from the BMC 132 to the B type sub block 141 corresponding to clock pulses. The value of the standardized path metric M00 that has been updated one clock period prior is supplied from the A type sub block 140 corresponding to the status S00 to the B type sub block 141. The B type sub block 141 adds the value of the standardized path metric M00 that has been updated one clock period prior and the value of the branch metric bm001 so as to calculate the sum of the likelihood in the case that the latest status transition is S00→S01 and latches the calculated result as a standardized path metric M01 that has been updated. The value of the standardized path metric M01 is supplied to the A type sub block 142 corresponding to the status S11 at a timing corresponding to clock pulses.

The structure of the B type sub block 143 corresponding to the status S10 is the same as the structure of the B type sub block 141. A branch metric mb110 corresponding to a status transition S11→S10 is supplied to the B type sub block 143. A standardized path metric M10 to be updated is latched by the B type sub block 143 and also supplied to the A type sub block 140 corresponding to the status S00.

Each sub block supplies the value of a standardized path metric updated at each time point corresponding to clock pulses to a standardized path metric comparing circuit 144. In other words, the A type sub block 140, the B type sub block 141, the A type sub block 142, and the B type sub block 143 supply the standardized path metrics M00, M0, M11, and M10 to the standardized path metric comparing circuit 144, respectively. The standardized path metric comparing circuit 14 outputs a two-bit signal MS corresponding to the minimum value of the four standardized path metrics to a merge block 135 (that will be described later).

Next, the structure of the SMU 134 will be described. The PMU 23 of the magneto-optic disc apparatus shown in FIG. 1 processes a decoded data value bit by bit. On the other hand, the SMU 134 processes a status data value two bits by two bits.

Figure 18:
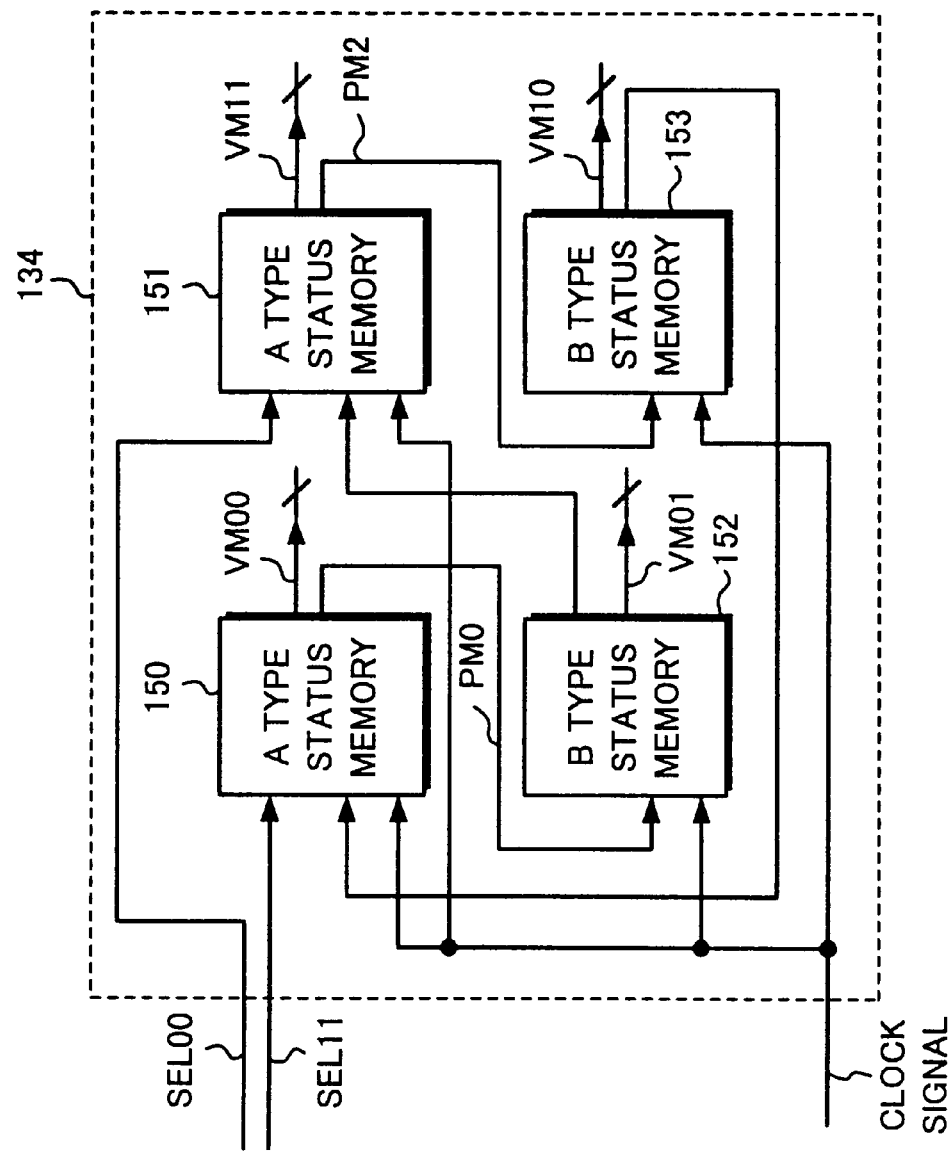
FIG. 18 is a block diagram showing an example of the structure of a status memory unit (SMU) according to an embodiment of the present invention.

As shown in FIG. 18, the SMU 134 has two A type status memories 150 and 151 and two B type status memories 152 and 153. In the SMU 134, signal lines for supplying selection signals SEL00 and SEL11, a clock signal, and status data are connected among the status memories. The A type status memories 150 and 151 correspond to statuses S00 and S11, respectively. The B type status memories 152 and 153 correspond to statuses S01 and S10, respectively. The four status memories are mutually connected corresponding to the status transition diagram shown in FIG. 14.

Figure 19:
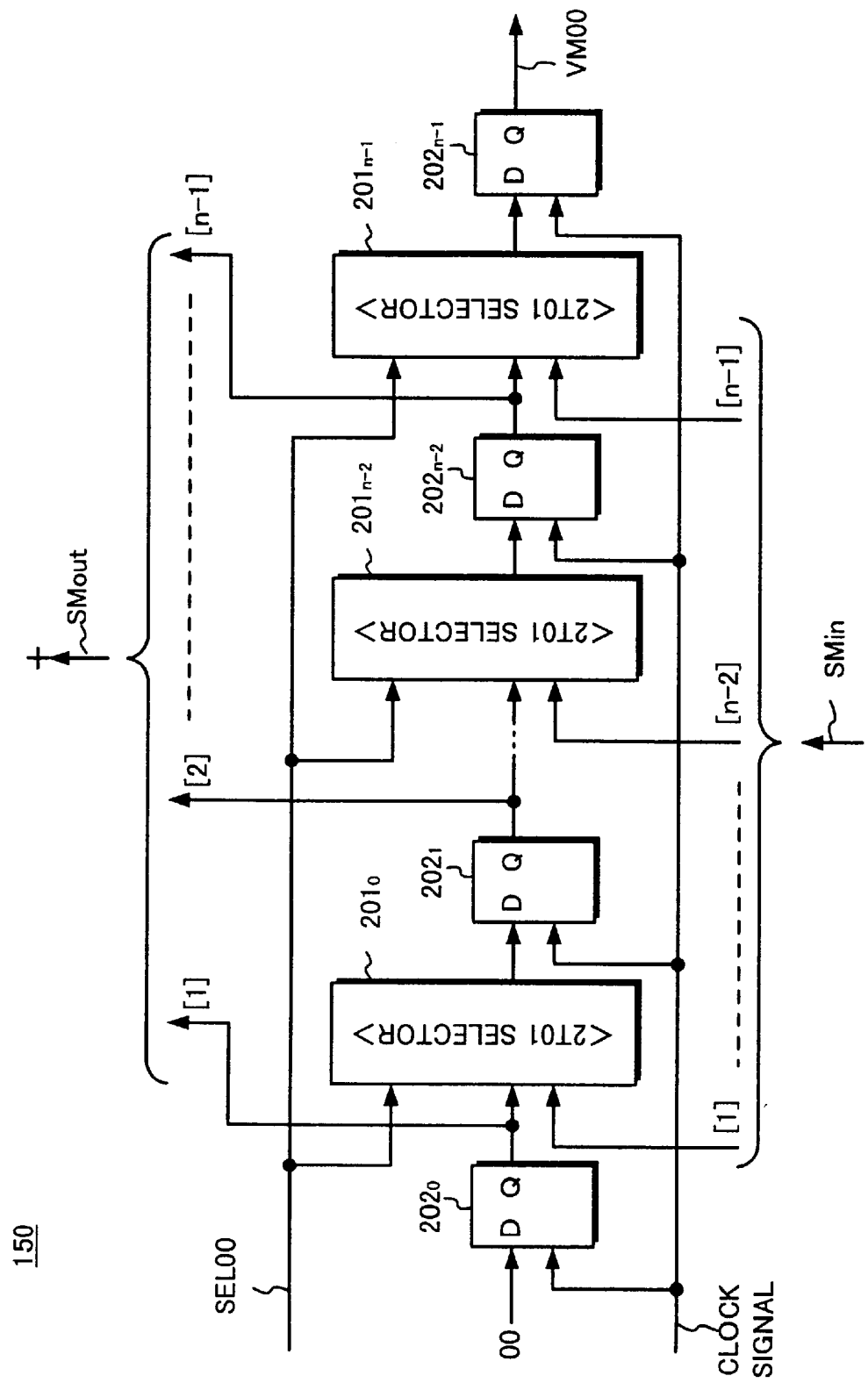
FIG. 19 is a block diagram for explaining the structure of a part of an SMU shown in FIG. 18.

Next, with reference to FIG. 19, the A type status memory 150 corresponding to the status S00 will be described. The A type status memory 150 has n processing stages. In other words, the A type status memory 150 has n selectors $201_0$, $201_1$ ... $201_{n-1}$ and n registers $202_0$ ... $202_{n-1}$ that are alternately connected. The selection signal SEL00 is supplied to the selectors $201_0$ to $201_{n-1}$. As described above, status data that is taken over from the B type status memory 151 that corresponds to the status S10 is supplied as SMin of n bits to each selector. Status data that is taken over to the B type status memory 152 that corresponds to the status S01 is output as SMout composed of (n−1) status data values to each register. In addition, clock pulses are supplied to the registers $202_0$ to $202_{n-1}$.

Next, the operation of each selector will be described. As shown in FIG. 14, statuses that change to the status S00 (namely, statuses one clock pulse prior) are S00 and S10. When a status one clock pulse prior is S00, a status transition where the self status is taken over takes place. Thus, "00" is input as the latest status data value of the status data values (as the serial shifting operation) to the selector $201_0$ on the first stage. In addition, the latest status data value SMin[1] of the status data values received from the B type status memory 153 is supplied as the parallel loading operation to the selector $201_0$. The selector $201_0$ supplies one of the two status data values to the register $202_0$ on the next stage corresponding to the selection signal SEL00.

Each of the selectors $201_1$ to $201_{n-1}$ on the second or later stages receives one status data value from the B type status memory 153 that corresponds to the status S10 as the parallel loading operation and one status data value from the register on the preceding stage as the serial shifting operation. Each of the selectors $201_1$ to $201_{n-1}$ supplies a status data value that is determined as the maximum likelihood corresponding to the selection signal SEL00 to the register on the next stage. Since all the selectors $201_0$ to $201_{n-1}$ operate corresponding to the same selection signal SEL00, a status data value as the maximum likelihood status data value selected by the ACS 133 is taken over.

In addition, the registers $202_0$ to $202_{n-1}$ store the supplied status data values corresponding to the clock pulses and update the stored status data values. Output data values of the individual registers are supplied to status memories corresponding to statuses that are changed one clock pulse later. In other words, since the status changes to S00, output data values of the relevant registers are supplied to the relevant selector on the next stage as the serial shifting operation. In addition, the output data values of the relevant registers are supplied as the parallel loading operation to the B type status memory 152 that corresponds to S01. The register $202_{n-1}$ on the last stage outputs a status data value VM00.

The structure of the A type status memory 151 that corresponds to the status S11 is the same as the structure of the A type status memory 150. However, a status data value is supplied from the B type status memory 152 that corresponds to S01 to the A type status memory 151 as the parallel loading operation corresponding to the status transition S01→S11 shown in FIG. 14. In addition, a status data value is supplied from the A type status memory 151 to the B type status memory 153 that corresponds to S10 as the parallel loading operation corresponding to the status transition S11→S10 shown in FIG. 14.

Figure 20:
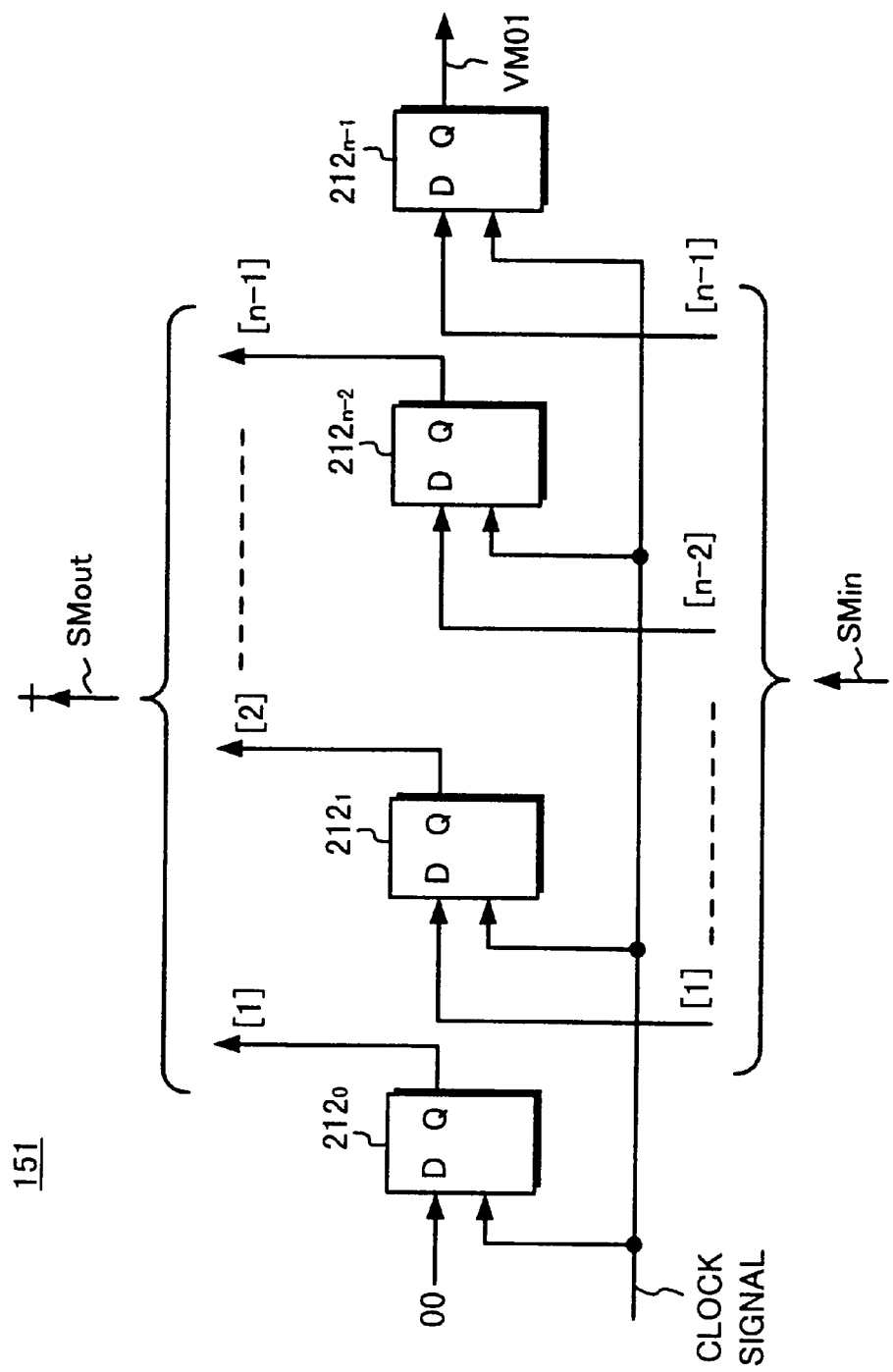
FIG. 20 is a block diagram for explaining the structure of another part of the SMU shown in FIG. 18.

Next, with reference to FIG. 20, the B type status memory 152 that corresponds to the status S01 will be described. The B type status memory 152 corresponds to a status that does not take over the self status in FIG. 14 and that has one status transition one clock pulse later. Thus, the B type status memory 152 neither performs the serial shifting operation, nor has selectors. In other words, the B type status memory 152 is composed of n registers $212_0$, $212_1$, ..., $212_{n-1}$. The clock pulses are supplied to the n registers $212_0$, $212_1$, ..., $212_{n-1}$ so as to match the operation timings thereof.

Status data values that are taken over from the A type status memory 150 that corresponds to the status S00 are supplied as SMin composed of (n−1) status data values to the registers $212_0$, $212_1$, ..., $212_{n-1}$. However, "00" is always input to the register $212_0$ on the first processing stage corresponding to clock pulses. This operation corresponds to the situation that the latest status transition that changes to S01 is always S00 as shown in FIG. 14. The registers $212_0$ to $212_{n-1}$ store received status data values corresponding to the clock pulses and thereby update the stored status data values. In addition, output data values of the registers $212_0$ to $212_{n-1}$ are supplied as SMout composed of (n−1) status data values to the A type status memory 151 that corresponds to the status S11 that takes place one clock pulse later. The register $212_{n-1}$ on the last stage outputs a status data value VM01.

The structure of the B type status memory 153 that corresponds to the status S10 is the same as that of the B type status memory 152. However, a status data value is supplied from the A type status memory 151 that corresponds to the status S11 to the B type status memory 153 as the parallel loading operation corresponding to the status transition S11→S10 shown in FIG. 14. In addition, a status data value is supplied from the B type status memory 153 to the A type status memory 150 that corresponds to the status S00 as the parallel loading operation corresponding to the status transition S10→S00 shown in FIG. 14. "11" is always input to the register on the first processing stage corresponding to the clock pulses. This operation corresponds to the situation that the status (one clock pulse prior) that can change to the status S10 is S11 as shown in FIG. 14.

In the Viterbi decoding method, status data values generated by the individual status memories substantially match each other. In other words, four status data values generated by the four status memories of the SMU 134 match each other. However, when the signal quality of a reproduced RF signal deteriorates due to an improper data recording condition or a physical defect of a recording medium, the four status data values VM00, VM11, VM01, and VM10 may mismatch each other. The probability of which such a mismatch takes place affects the performance, operation parameter, and so forth of each structural portion of the reproducing system.

On the other hand, when the signal quality of a reproduced RF signal and the condition of the reproducing system do not vary, as the memory length (namely, the number of processing stages) of the status memories is large, the probability of which a mismatch takes place in status data values is lowered. However, as the memory length of the status memories is large, the circuit scale of the SMU and the delay time due to the operation of the SMU become large. Thus, it is not practical to excessively increase the memory length of the status memories. Practically, in a precondition of which a mismatch takes place in status data values to some extent, a structure that allows the most adequate status data values to be selected is occasionally disposed.

In the case that the memory length of the status memories is constant, when the number of mismatches of status data values is counted, with the counted value, the quality of status data values and decoded data generated corresponding thereto can be evaluated. In addition, with the counted value, the quality of a reproduced signal and the adaptivity of operation parameters of individual structural portions of the reproducing system against the reproduced signal can be evaluated. A merge block (that will be described later) has a structure that counts the number of mismatches of status data values.

Figure 21:
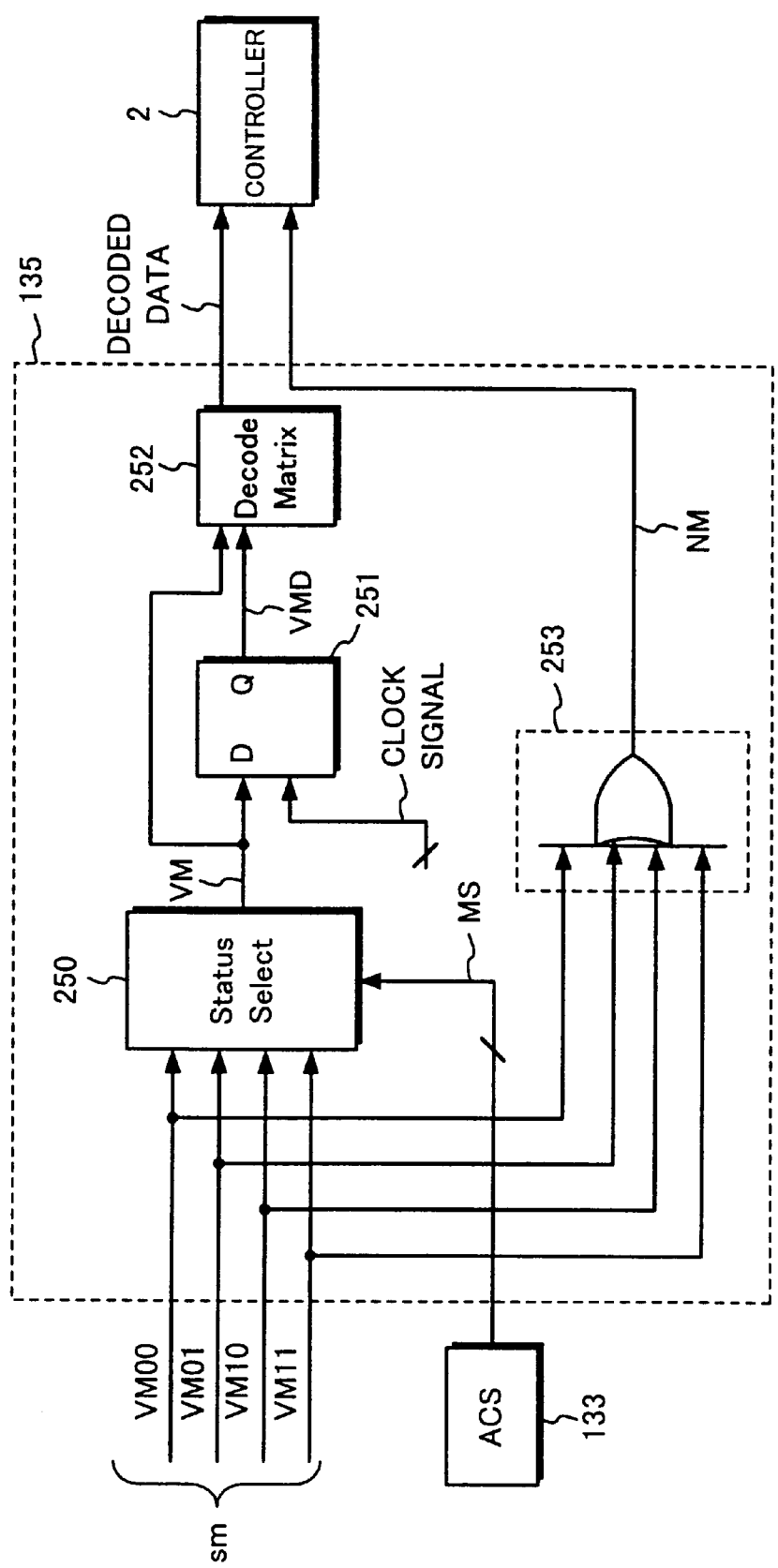
FIG. 21 is a block diagram showing an example of the structure of a merge block according to an embodiment of the present invention.

Next, with reference to FIG. 21, an example of the merge block 135 will be described. Referring to FIG. 21, the merge block 135 comprises a status selecting circuit 250, a register 251, a decoding matrix portion 252, and a mismatch detecting circuit 253. The status selecting circuit 250 selects an adequate one from the status data values VM00, VM11, VM01, and VM10 supplied at a timing corresponding to clock pulses. The register 251 delays the output value of the status selecting circuit 250 by one clock period. The mismatch detecting circuit 253 detects a mismatch of the status data values VM00, VM11, VM01, and VM10.

The status selecting circuit 250 references a two-bit signal MS received from the ACS 133, selects the most adequate one from VM00, VM11, VM01, and VM10, and outputs the selected status data value as VM. The selected status data value VM is selected with reference to a matrix (see FIG. 22) stored in a means such as a ROM. Thus, the probability of which the correctest status data value is selected becomes high.

The selected status data value VM is supplied to the register 251 and the decoding matrix portion 252. The register 251 delays the selected status data value VM by one clock period and supplies the resultant data value to the decoding matrix portion 252. In the following description, the output data value of the register 251 is denoted by VMD. Thus, the status data value VM and the status data value VMD that has been delayed by one clock period are supplied to the decoding matrix portion 252. The decoding matrix portion 252 stores the decoding matrix shown in FIG. 23 in a means such as a ROM. The decoding matrix portion 252 references the decoding matrix and outputs a decoded data value corresponding to VM and VMD. Such an operation is performed at a timing corresponding to clock pulses and thereby decoded data is generated.

Next, the decoding matrix shown in FIG. 23 will be described. From the status transition diagram shown in FIG. 14, it is clear that decode data values correspond to two successive status data values. When a status data value VM at a time point t is "01" and a status data value VMD at a time point t-1 one clock period prior is "00", the decode data is "1" as shown in FIG. 23.

On the other hand, the mismatch detecting circuit 253 can be structured with for example an exclusive-OR circuit. The status data values VM00, VM11, VM01, and VM10 are supplied to the mismatch detecting circuit 253. The mismatch detecting circuit 253 detects a mismatch of these four status data values and outputs the detected result as a mismatch detection signal NM. Unless all the four status data values match, the mismatch detection signal NM is enable or active. According to the embodiment of the present invention, the mismatch detecting circuit 253 is disposed in the merge block 135. However, it should be noted that the mismatch detecting circuit 253 can be disposed in other than the merge block 135 as long as all status data values are supplied from the SMU 134 to the mismatch detecting circuit 253.

The mismatch detecting signal NM is output to a predetermined counting means disposed in the controller 200 whenever four status data values are supplied at a timing corresponding to clock pulses. In such a structure, the number of mismatches of four status data values is counted at predetermined intervals (namely, sector by sector). According to the embodiment of the present invention, the counting means is disposed in the controller 200. However, it should be noted that the counting means can be disposed in other than the controller 200 as long as the mismatch detection signal NM is supplied to the counting means.

Corresponding to the counted value of the counting means, the following operation can be performed.

When the counted value exceeds a predetermined threshold value in a particular sector, determining that the reliability of decoded data is not sufficient, such a sector is prevented from being decoded. In other words, the decoding process can be controlled corresponding to the decoded data.

When the counted value in a predetermined period exceeds a predetermined threshold value, determining that the quality of a reproduced signal is not adequate due to an improper operating condition of the reproducing system, an operating condition of the reproducing system is controlled (for example, operation parameters of structural portions (optical pickup 7, amplifiers 8 and 9, and/or filter portion 11) of the reproducing system are varied).

When the counted value in a predetermined period exceeds a predetermined threshold value, determining that the quality of a reproduced signal is not adequate due to an improper recording condition, an operating condition of the recording system is controlled (for example, operation parameters of structural portions of the recording system are varied).

When the counted value in a predetermined period exceeds a predetermined value, the operation of the overall apparatus is controlled (for example, the apparatus is reset).

Any one of the above-described controlling operations can be performed. Alternatively, two or more controlling operations can be performed in combination. In addition, two or more threshold values may be designated for the counted value. In this case, when the counted value exceeds the smaller threshold value, the operation parameters of the structural portions of the reproducing system may be varied. In contrast, when the counted value exceeds the larger threshold value, the apparatus may be reset. In this case, a structure of which the counted value is supplied to a controlling means such as the controller 200 may be used.

On the other hand, when mismatches or matches of status data values detected in the above-described manner are monitored on real time basis, a situation of which the Viterbi decoder does not normally operate due to a large defect of a record medium can be detected. In such a case, a proper process is performed (for example, the Viterbi decoder is reset).

With status data values, the positions of the leading edge and the trailing edge of a reproduced RF signal can be detected. A structure for detecting the phase error signal of the PLL corresponding to the positions of the leading edge and trailing edge of a reproduced RF signal may be added.

According to the embodiment of the present invention, the mismatch detecting circuit 253 is disposed. The mismatch detecting circuit 253 detects mismatches of the four status data values VM00, VM11, VM01, and VM10 and counts the number of mismatches. In contrast, with a match detecting means, matches of the status data values may be detected and the number of mismatches may be counted. In this case, when the counted value is smaller than a predetermined threshold value, the operation parameters of the reproducing system are varied.

The embodiment of the present invention is applied to a magneto-optical disc apparatus corresponding to four-value four-status Viterbi decoding method. However, it should be noted that the present invention is applied to magneto-optical disc apparatuses corresponding to other types of Viterbi decoding methods such as three-value four-status Viterbi decoding method, and seven-value six-status Viterbi decoding method. In these cases, SMU is to have as many status memories as the number of status. And, mismatch detection circuit, and so forth is to run based on as many status data values as the number of statuses.

In addition, the present invention can be applied to an information reproducing apparatus corresponding to Viterbi decoding method for decoding read data from data recorded on a record medium. In other words, the present invention can be also applied to rewritable discs (such as phase change type disc PD and CD-E (CD-Erasable)), recordable discs (such as CD-R), and read-only discs (such as CD-ROM).

It should be noted that the present invention is not limited to the above-described embodiment. Instead, without departing from the spirit of the present invention, various changes and modifications are available.

As described above, according to the present invention, with status data that represents the maximum likelihood status transition selected corresponding to calculated results of a reproducing signal, the following processes can be performed.

Corresponding to such status data, decoded data can be generated.

Matches or mismatches of status data generated by status memories disposed in the SMU can be detected corresponding to respective statuses.

By counting the number of mismatches or matches of the status data detected in a predetermined period (for example, every sector), the count value can be used to evaluate status data in each predetermined period and the quality of decoded data generated corresponding to the status data values.

Such a count value can be used to evaluate the signal quality of a reproduced signal and the degree of the adaptivity of operation parameters or the like of individual structural portions of the reproducing system to the reproduced signal. Thus, the operation conditions of the reproducing system can be adjusted corresponding to such a count value.

In addition, since the quality of a reproduced signal is affected by conditions in the recording operation, the operation conditions of the recording system can be adjusted corresponding to the evaluation of the signal quality of the reproduced signal.

Thus, for example, the calibrating operation for adjusting the recording/reproducing conditions can be accurately performed corresponding to such a count value.

On the other hand, when mismatches or matches of status data detected in such a manner are monitored on real time basis, even if the Viterbi decoder does not correctly operate due to a large defect on a record medium, a proper process such as a resetting operation of the Viterbi decoder can be performed.

In addition, corresponding to such status data values, a phase error detecting timing of PLL can be obtained. With the phase error detecting timing, a phase error signal can be generated.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

What is claimed is:

1. An information reproducing apparatus for reproducing, according to a Viterbi decoding method, data that has been RLL (Run Length Limited) encoded and recorded on a recording medium, comprising:

branch metric calculating means for calculating branch metrics for all statuses at a particular time point corresponding to an input reproduced signal;

path metric updating means for selecting a maximum likelihood path metric of each of the statuses corresponding to values of which the branch metrics and preceding path metrics are added, for outputting a first selection signal corresponding to the selected maximum likelihood path metric, and for outputting a second selection signal corresponding to minimum values of the path metrics;

status data generating means, having a plurality of status memories corresponding to the statuses, for updating status data that represents the statuses corresponding to the first selection signal;

status data selecting means for selecting a most adequate status data from the status data stored in the status memories corresponding to the second selection signal and for outputting the selected most adequate status data;

data decoding means for outputting decoded data corresponding to the selected most adequate status data and a just preceding most adequate status data;

mismatch detecting means for detecting mismatches of the status data stored in the status memories;

counting means for counting a number of the mismatches of the status data corresponding to output data of said mismatch detecting means; and controlling means for controlling a decoding process according to the number counted by said counting means.

2. The information reproducing apparatus as set forth in claim 1, wherein the status data has a particular number of bits that represent all statuses of reproduced signals that take place in the Viterbi decoding method.

3. The information reproducing apparatus as set forth in claim 2, wherein the Viterbi decoding method is a four-value four-status Viterbi decoding method, and wherein the status data has a sequence of two-bit data.

4. The information reproducing apparatus as set forth in claim 2, wherein said status data generating means updates the status data for the particular number of bits at a time.

5. An information reproducing apparatus for reproducing, according to a Viterbi decoding method, data that has been RLL (Run Length Limited) encoded and recorded on a recording medium, comprising:

branch metric calculating means for calculating branch metrics for all statuses at a particular time point corresponding to an input reproduced signal;

path metric updating means for selecting a maximum likelihood path metric of each of the statuses corresponding to values of which the branch metrics and preceding path metrics are added, for outputting a first selection signal corresponding to the selected maximum likelihood path metric, and for outputting a second selection signal corresponding to minimum values of the path metrics;

status data generating means, having a plurality of status memories corresponding to the statuses, for updating status data that represents the statuses corresponding to the first selection signal;

status data selecting means for selecting a most adequate status data from the status data stored in the status memories corresponding to the second selection signal and for outputting the selected most adequate status data;

data decoding means for outputting decoded data corresponding to the selected most adequate status data and a just preceding most adequate status data;

match detecting means for detecting matches of the status data stored in the status memories;

counting means for counting a number of the matches of the status data corresponding to output data of said match detecting means; and controlling means for controlling a decoding process according to the number counted by said counting means.

6. The information reproducing apparatus as set forth in claim 5, wherein the status data has a particular number of bits that represent all statuses of reproduced signals that take place in the Viterbi decoding method.

7. The information reproducing apparatus as set forth in claim 6, wherein the Viterbi decoding method is a four-value four-status Viterbi decoding method, and wherein the status data has a sequence of two-bit data.

8. The information reproducing apparatus as set forth in claim 6, wherein said status data generating means updates the status data for the particular number of bits at a time.

9. An information reproducing apparatus for reproducing, according to a Viterbi decoding method, data that has been RLL (Run Length Limited) encoded and recorded on a recording medium, comprising:

branch metric calculating means for calculating branch metrics for all statuses at a particular time point corresponding to an input reproduced signal;

path metric updating means for selecting a maximum likelihood path metric of each of the statuses corresponding to values of which the branch metrics and preceding path metrics are added, for outputting a first selection signal corresponding to the selected maximum likelihood path metric, and for outputting a second selection signal corresponding to minimum values of the path metrics;

status data generating means, having a plurality of status memories corresponding to the statuses, for updating status data that represents the statuses corresponding to the first selection signal;

status data selecting means for selecting a most adequate status data from the status data stored in the status memories corresponding to the second selection signal and for outputting the selected most adequate status data;

data decoding means for outputting decoded data corresponding to the selected most adequate status data and a just preceding most adequate status data;

wherein said data decoding means references a table that has been created corresponding to the status data at a particular time point and successive status data thereof and outputs the decoded data.

10. A many-value many-status Viterbi decoding apparatus for use with four-value four-status Viterbi decoding method with a waveform equalizing characteristic of PR(B, 2A, B), comprising:

an ACS circuit having:
adding devices for adding branch metrics of individual statuses and past path metrics,
a comparing and selecting device for comparing output data of the adding devices and selecting a maximum likelihood path metric, and
a storing circuit for storing the selected maximum likelihood path metric;

a status memory circuit, having a plurality of status memories corresponding to the statuses, for generating status data that represents a status transition corresponding to the selected maximum likelihood path metric;

a selecting circuit for selecting one of the status data stored in the status memories and outputting the selected status data; and an exclusive-OR circuit for detecting whether or not the status data stored in the status memories match.

11. The Viterbi decoding apparatus as set forth in claim 10, wherein said ACS circuit outputs a selection signal corresponding to a path metric with a minimum value from the path metrics of the statuses, and wherein said selecting circuit selects status data corresponding to the selection signal.

12. The Viterbi decoding apparatus as set forth in claim 10, further comprising:

a decoding circuit for generating decoded data corresponding to the status data selected by said selecting circuit and a just preceding status data thereof.

13. An information reproducing method of reproducing, according to a Viterbi decoding method, data that has been RLL (Run Length Limited) encoded and recorded on a recording medium, comprising the steps of:

calculating branch metrics for all statuses at a particular time point corresponding to an input reproduced signal;

selecting a maximum likelihood path metric of each of the statuses corresponding to values of which the branch metrics and preceding path metrics are added, outputting a first selection signal corresponding to the selected maximum likelihood path metric, and outputting a second selection signal corresponding to minimum values of the path metrics;

updating status data that represents the statuses corresponding to the first selection signal;

selecting a most adequate status data from the updated status data corresponding to the second selection signal, and outputting the selected most adequate status data;

outputting decoded data corresponding to the selected most adequate status data and a just preceding most adequate status data;

detecting one of matches and mismatches of the updated status data;

counting a number of said one of matches and mismatches; and controlling, according to the counted number, said step of outputting.

14. The information reproducing apparatus as set forth in claim 13, wherein said step of outputting references a table that has been created corresponding to the status data at a particular time point and successive status data thereof and outputs the decoded data.

15. The information reproducing method as set forth in claim 13, wherein the status data has a particular number of bits that represent all statuses of reproduced signals that take place in the Viterbi decoding method.

16. The information reproducing apparatus as set forth in claim 15, wherein the Viterbi decoding method is a four-value four-status Viterbi decoding method, and wherein the status data has a sequence of two-bit data.

17. The information reproducing apparatus as set forth in claim 15, wherein said step of updating updates the status data for the particular number of bits at a time.

18. A four-value four-status Viterbi decoding method with a waveform equalizing characteristic of PR(B, 2A, B), comprising the steps of:

adding branch metrics of individual statuses and past path metrics;

comparing output data of the adding step and selecting a maximum likelihood path metric; and storing the selected maximum likelihood path metric;

generating and storing status data that represents a status transition corresponding to the selected maximum likelihood path metric;

selecting one of the stored status data and outputting the selected status data; and detecting whether or not the stored status data match.

19. The Viterbi decoding method as set forth in claim 18, further comprising:

generating decoded data corresponding to the selected status data and a just preceding selected status data.

* * * * *

UNITED STATES PATENT AND TRADEMARK OFFICE
CERTIFICATE OF CORRECTION

PATENT NO. : 6,192,502 B1
DATED : February 20, 2001
INVENTOR(S) : Shigeo Yamaguchi et al.

It is certified that error appears in the above-identified patent and that said Letters Patent is hereby corrected as shown below:

Column 1,
Line 35, insert -- to -- between "equal" and "the";
Line 50, insert -- the -- between "of" and "path";
Line 59, delete ". Thus".

Column 2,
Line 66, change "advantage" to -- advantages --.

Column 6,
Line 36, change "filed" to -- field --.

Column 7,
Line 51-52, change "as to" to -- to as --.

Column 9,
Lines 8-9, insert -- the -- between "of" and "methods".

Column 12,
Line 55, insert -- ) -- between "of" and "methods".
Line 58, change "case" to -- cases --.

Column 15,
Line 6, change "th" to -- the --;
Line 16, insert -- →2 -- between "S0" and ".".
Line 28, change "The" to -- the --.

Column 16,
Line 60, change "descried" to -- described --.

Column 18,
Lines 41-42, start a new paragraph with "O" and connect phrase beginning with "$_o$" with rest of sentence.

Column 19,
Line 42, change "takes" to -- take --.

UNITED STATES PATENT AND TRADEMARK OFFICE
CERTIFICATE OF CORRECTION

PATENT NO.   : 6,192,502 B1
DATED         : February 20, 2001
INVENTOR(S)  : Shigeo Yamaguchi et al.

It is certified that error appears in the above-identified patent and that said Letters Patent is hereby corrected as shown below:

Column 20,
Line 17, change "methods" to -- method --;
Line 50, change "S1" to -- S11 --.

Column 23,
Line 5, change "M0" to -- M01 --;
Line 29, change "$201_{0n}$" to -- $201_0$ --;
Line 61, change "$201$" to -- 201 --.

Column 25,
Line 47, change "correctest" to -- most correct --;
Line 66, change "decode" to -- decoded --.

Column 27,
Line 27, insert -- th -- between "as" and "three".

Please substitute Figure 4 with the attached Figure 4. Substitute Figure 4 is provided to change "colck" to -- clock --.

Signed and Sealed this

Twelfth Day of February, 2002

JAMES E. ROGAN
Director of the United States Patent and Trademark Office

Attest:

Attesting Officer